(12) United States Patent
Han et al.

(10) Patent No.: US 12,183,277 B2
(45) Date of Patent: Dec. 31, 2024

(54) PIXEL CIRCUIT, DISPLAY PANEL, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Linhong Han, Beijing (CN); Qiwei Wang, Beijing (CN); Shun Zhang, Beijing (CN); Benlian Wang, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/768,246

(22) PCT Filed: Mar. 29, 2021

(86) PCT No.: PCT/CN2021/083542
§ 371 (c)(1),
(2) Date: Apr. 12, 2022

(87) PCT Pub. No.: WO2022/204863
PCT Pub. Date: Oct. 6, 2022

(65) Prior Publication Data
US 2024/0119895 A1   Apr. 11, 2024

(51) Int. Cl.
*G09G 3/3233*   (2016.01)
*H10K 59/131*   (2023.01)

(52) U.S. Cl.
CPC ......... *G09G 3/3233* (2013.01); *H10K 59/131* (2023.02); *G09G 2300/0426* (2013.01); *G09G 2300/0852* (2013.01)

(58) Field of Classification Search
CPC ......... G09G 3/3233; G09G 2300/0426; G09G 2300/0852; H10K 59/131
See application file for complete search history.

(56) References Cited

U.S. PATENT DOCUMENTS

| 11,373,599 | B1* | 6/2022 | Chen | G09G 3/3233 |
| 2014/0034923 | A1 | 2/2014 | Kim et al. | |
| 2016/0379562 | A1* | 12/2016 | Yoon | G09G 3/3233 345/215 |
| 2018/0286314 | A1 | 10/2018 | Cho et al. | |
| 2021/0202659 | A1* | 7/2021 | Lee | H10K 59/131 |

OTHER PUBLICATIONS

First office action of German application No. 112021001343.2 issued on Jan. 10, 2024.

* cited by examiner

*Primary Examiner* — Stacy Khoo
(74) *Attorney, Agent, or Firm* — Lippes Mathias LLP

(57) ABSTRACT

Provided is a pixel circuit. The pixel circuit includes a semiconductor layer on a side of a base substrate, wherein the semiconductor layer is configured to form an active layer of each of various transistors in the pixel circuit; a first metal layer on the side of the base substrate, wherein the first metal layer is configured to form a gate electrode of the transistor and a first capacitive electrode of a storage capacitor in the pixel circuit; and a second metal layer on the side of the base substrate, wherein the second metal layer is configured to form a second capacitive electrode of the storage capacitor.

17 Claims, 19 Drawing Sheets

PIXEL CIRCUIT, DISPLAY PANEL, AND DISPLAY DEVICE

CROSS-REFERENCE TO RELATED APPLICATION

This application is a 371 of PCT application No. PCT/CN2021/083542, filed on Mar. 29, 2021, the content of which is herein incorporated by reference in its entirety.

TECHNICAL FIELD

The present disclosure relates to the field of display technologies, and in particular, relates to a pixel circuit, a display panel, and a display device.

BACKGROUND

A pixel circuit is generally connected to a light-emitting element, and is configured to drive the light-emitting element to emit light.

In the related art, the pixel circuit at least includes a light-emitting control transistor, a data write transistor, and a reset transistor, and the transistors may be formed by an active layer and a gate electrode metal layer which are laminated in sequence. A gate electrode metal layer of the data write transistor, a gate electrode metal layer of the reset transistor, and a gate electrode metal layer of the light-emitting, control transistor are sequentially arranged along a target direction.

SUMMARY

Embodiments of the present disclosure provide a pixel circuit, a display panel, and a display device, and the technical solution is as follows.

In one aspect, a pixel circuit is provided. The pixel circuit includes:
   a semiconductor layer on a side of a base substrate, wherein the semiconductor layer is configured to form an active layer of each of various transistors in the pixel circuit, the active layer including a channel region, and a source electrode region and a drain electrode region that are disposed on both sides of the channel region;
   a first metal layer on the side of the base substrate, wherein the first metal layer is configured to form a gate electrode of the transistor and a first capacitive electrode of a storage capacitor in the pixel circuit, an overlap region being present between the gate electrode of the transistor and the channel region; and
   a second metal layer on the side of the base substrate, wherein the second metal layer is configured to form a second capacitive electrode of the storage capacitor, the second capacitive electrode being at least partially overlapped with the first capacitive electrode, and the second capacitive electrode being coupled to a drive power line extending along a first direction;
   wherein the gate electrodes of the transistors and the storage capacitor are arranged in sequence along the first direction; the second capacitive electrodes of each two adjacent pixel circuits are coupled via a connection portion along a second direction, wherein the connection portion is disposed on the same layer as the second metal layer, the connection portion is parallel to the channel region of at least one of the various transistors, and the connection portion are overlapped with a data signal line extending along the first direction, the first direction being perpendicular to the second direction.

Optionally, in the various transistors, a gate electrode of a light-emitting control transistor is disposed between a gate electrode of a reset transistor and a gate electrode of a data write transistor.

Optionally, along the first direction, the gate electrode of the reset transistor and the gate electrode of the data write transistor are disposed on both sides of the storage capacitor.

Optionally, along the first direction, the gate electrode of the reset transistor and the gate electrode of the light-emitting control transistor are disposed on the same side of the storage capacitor.

Optionally, the data write transistor includes a first data write transistor and a second data write transistor; the reset transistor includes a first reset transistor and a second reset transistor; and the light-emitting control transistor includes a first light-emitting control transistor and a second light-emitting control transistor; wherein a drain electrode region of the first data write transistor is coupled to a drain electrode region of a drive transistor in each of the transistors, and a source electrode region of the first data write transistor is coupled to a gate electrode of the drive transistor; a drain electrode region of the second data write transistor is coupled to a source electrode region of the drive transistor, and a source electrode region of the second data write transistor is coupled to the data signal line; and both a gate electrode of the first data write transistor and a gate electrode of the second data write transistor are coupled to a gate electrode drive line;

both a source electrode region of the first reset transistor and a source electrode region of the second reset transistor are coupled to a reset signal line; both a gate electrode of the first reset transistor and a gate electrode of the second reset transistor are coupled to a reset control line; a drain electrode region of the first reset transistor is coupled to the gate electrode of the drive transistor in each of the transistors, and a drain electrode region of the second reset transistor is coupled to an anode of a light-emitting element; and a drain electrode region of the first light-emitting control transistor is coupled to the source electrode region of the drive transistor, and a source electrode region of the first light-emitting control transistor is coupled to the drive power line; a drain electrode region of the second light-emitting control transistor is coupled to the anode of the light-emitting element, a source electrode region of the second light-emitting control transistor is coupled to the drain electrode region of the drive transistor, and both a gate electrode of the first light-emitting control transistor and a gate electrode of the second light-emitting control transistor are coupled to a light-emitting control line.

Optionally, the semiconductor layer includes a first semiconductor pattern and a second semiconductor pattern that are spaced apart, wherein both the first semiconductor pattern and the second semiconductor pattern are coupled to the reset signal line; and the first semiconductor pattern is configured to form an active layer of the first reset transistor, and the second semiconductor pattern is configured to form active layers of the transistors other than the first reset transistor.

Optionally, each of an active layer of the first data write transistor and the active layer of the first reset transistor includes at least two bent portions.

Optionally, an orthographic projection of the active layer of the first data write transistor on the base substrate is U-shaped.

Optionally, an orthographic projection of the active layer of the first reset transistor on the base substrate is U-shaped.

Optionally, the second metal layer includes a first metal pattern and a second metal pattern;
wherein the first metal pattern is configured to form the second capacitive electrode, and the second metal pattern is partially overlapped with the active layer of the first data write transistor.

Optionally, the second metal pattern is further partially overlapped with the active layer of the first reset transistor.

Optionally, the second metal pattern includes a first extending region and a second extending region; wherein
the first extending region is overlapped with the active layer of the first data write transistor, and an extending line of the first extending region is overlapped with a coupled part of the second data write transistor and the data signal line; and
the second extending region is overlapped with the active layer of the first reset transistor;
wherein an extending direction of the first extending region is parallel to an extending direction of the second extending region.

Optionally, the second metal pattern further includes a first connection region and a second connection region;
wherein an extending direction of the first connection region is intersected with an extending direction of the second extending region, the extending direction of the second extending region is intersected with an extending direction of the second connection region, and the extending direction of the second connection region is intersected with the extending direction of the first extending region; and the first connection region, the first extending region, the second connection region, and the second extending region are connected in sequence.

Optionally, the second metal pattern is configured to receive a reset signal.

Optionally, the pixel circuit further includes a third metal layer on the side of the base substrate, the third metal layer including a first metal block, a second metal block, a third metal block, a fourth metal block and a fifth metal block that are spaced apart;
wherein the first metal block is configured to receive a data signal; the second metal block is configured to receive a drive power signal; both the drain electrode region of the first reset transistor and the drain electrode region of the first data write transistor are coupled to the gate electrode of the drive transistor through the third metal block; both the source electrode region of the first reset transistor and the source electrode region of the second reset transistor are coupled to the reset signal line through the fourth metal block; and both the drain electrode region of the second reset transistor and the source electrode region of the second light-emitting control transistor are coupled to the anode of the light-emitting element through the fifth metal block.

Optionally, the second metal block includes a first extending portion and a second extending portion that extend in sequence along the first direction and are coupled to each other;
wherein an included angle between the first extending portion and the second extending portion is less than or equal to 90 degrees, and the included angle faces towards the storage capacitor; an extending line of the first extending portion is overlapped with a hollowed region of the second capacitive electrode, and along the second direction, the second extending portion and the first metal block are disposed on the same side of the hollowed region.

Optionally, the second metal block further includes a third extending portion extending along the first direction, the third extending portion being coupled to the second extending portion;
wherein an included angle between the third extending portion and the second extending portion is less than 90 degrees, the included angle faces towards the storage capacitor, and an extending line of the third extending portion is overlapped with the hollowed region of the second capacitive electrode.

Optionally, along the first direction, the third metal block is across the light-emitting control line.

Optionally, along the first direction, the third metal block is across the storage capacitor.

Optionally, the fourth metal block includes: a first conductive segment and a second conductive segment; wherein
the first conductive segment and the second conductive segment are coupled to the source electrode region of the first reset transistor and the source electrode region of the second reset transistor in the same pixel circuit; and
the first conductive segment extends along the first direction, the second conductive segment extends along the second direction, and the first conductive segment is across the reset signal line.

Optionally, the fifth metal block includes: a main body segment and an extending segment;
wherein along the first direction, the fifth metal block is across the light-emitting control line, and the extending segment in the fifth metal block is overlapped with the light-emitting control line.

In another aspect, a display panel is provided. The display panel includes: a base substrate, and a plurality of pixels on a side of the base substrate, wherein each of the plurality of pixels includes a plurality of sub-pixels, at least one of the plurality of sub-pixels including: a light-emitting element, and the pixel circuit as defined in the above aspect;
wherein the pixel circuit is connected to the light-emitting element, and the pixel circuit is configured to drive the light-emitting element to emit light.

Optionally, the anode of the light-emitting element is overlapped with the light-emitting control line coupled to the pixel circuit, and is partially overlapped with the second capacitive electrode in the pixel circuit.

Optionally, each of the plurality of pixels includes: at least four sub-pixels;
wherein in the at least four sub-pixels, the light-emitting elements of at least two sub-pixels overlapped with the gate electrode drive line coupled to the pixel circuit, and the light-emitting elements of at least two sub-pixels are distributed on both sides of the gate electrode drive line.

Optionally, two adjacent pixel circuits in the same column share one data signal line and share one drive power line; and two adjacent pixel circuits in the same row share one reset signal line.

Optionally, the pixel circuit further includes: a planarization layer on a side, distal from the base substrate, of the third metal layer, the anode of the light-emitting element is disposed on a side, distal from the base substrate, of the planarization layer, and the anode of the light-emitting element is coupled to the third metal layer through a via hole penetrating the planarization layer.

In yet another aspect, a display device is provided. The display device includes: a power supply assembly, and the display panel according to the above aspect;

wherein the power supply assembly is coupled to the display panel and is configured to supply power to the display panel.

BRIEF DESCRIPTION OF THE DRAWINGS

For clearer description of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, the embodiments of the present disclosure are described in detail hereinafter with reference to the accompanying drawings.

Figure 1:
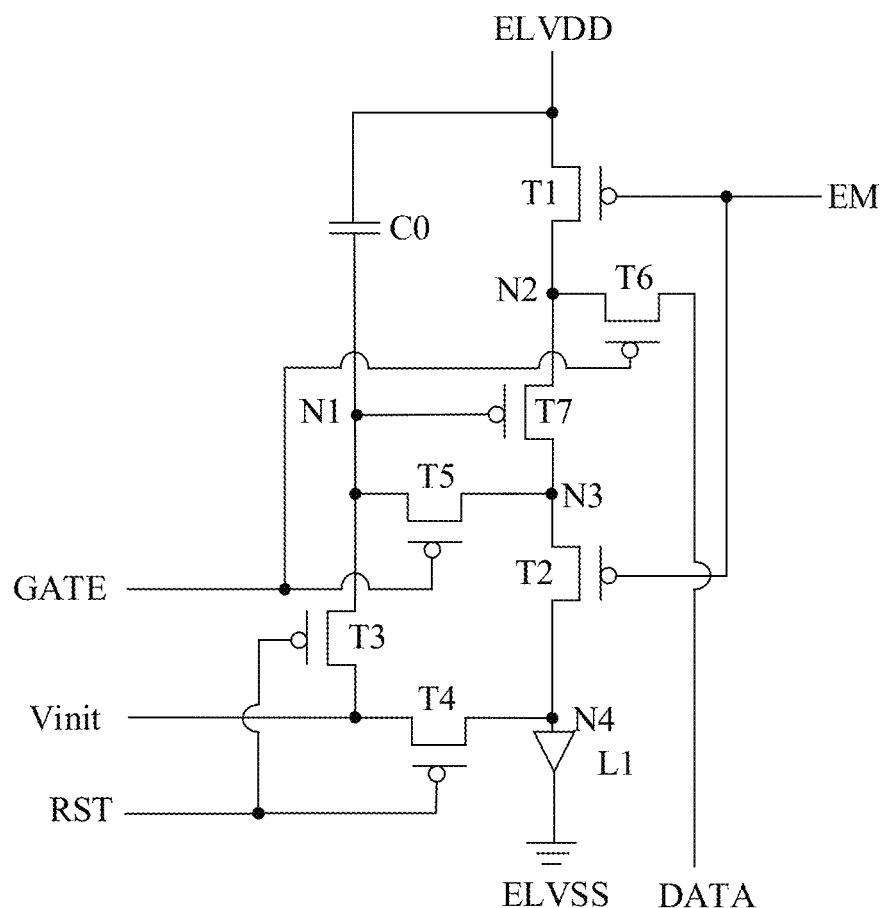
FIG. 1 is a circuit structure diagram of a pixel circuit according to an embodiment of the present disclosure.

FIG. 1 is a circuit structure diagram of a pixel circuit according to an embodiment of the present disclosure. As shown in FIG. 1, the pixel circuit may include a first light-emitting control transistor T1, a second light-emitting control transistor T2, a first reset transistor T3, a second reset transistor T4, a first data write transistor T5, a second data write transistor T6, a drive transistor T7, and a storage capacitor C0.

A first terminal (also referred to as a second capacitive electrode) of the storage capacitor C0 may be coupled to a drive power line ELVDD, and a second terminal (also referred to as a first capacitive electrode) of the storage capacitor C0 may be coupled to a gate electrode (i.e., a first node N1 in the drawing) of the drive transistor T7. Coupling may refer to electrical connection.

Both a gate electrode of the first light-emitting control transistor T1 and a gate electrode of the second light-emitting control transistor T2 may be coupled to a light-emitting control line EM. A drain electrode of the first light-emitting control transistor T1 may be coupled to a source electrode (i.e., a second node N2 in the drawing) of the drive transistor T7, and a source electrode of the first light-emitting control transistor T1 may be coupled to the drive power line ELVDD. A source electrode of the second light-emitting control transistor T2 may be coupled to a drain electrode (i.e., a third node N3 in the drawing) of the drive transistor T7, and a drain electrode of the second light-emitting control transistor T2 may be coupled to an anode (i.e., a fourth node N4 in FIG. 1) of a light-emitting element L1. The first light-emitting control transistor T1 may control the conduction/non-conduction between the drive power line ELVDD and the source electrode of the drive transistor T7 in response to a light-emitting control signal supplied by the light-emitting control line EM. The second light-emitting control transistor T2 may control the conduction/non-conduction between the drain electrode of the drive transistor T7 and the anode of the light-emitting element L1 in response to the light-emitting control signal.

Both a gate electrode of the first reset transistor T3 and a gate electrode of the second reset transistor T4 may be coupled to a reset control line RST. Both a source electrode of the first reset transistor T3 and a source electrode of the second reset transistor T4 may be coupled to a reset signal line Vinit. A drain electrode of the first reset transistor T3 may be coupled to the gate electrode of the drive transistor T7, and the source electrode of the second reset transistor T4 may be coupled to the anode of the light-emitting element L1. The first reset transistor T3 may control the conduction/non-conduction between the reset signal line Vinit and the gate electrode of the drive transistor T7 in response to a reset control signal supplied by the reset control line RST. The second reset transistor T4 may control the conduction/non-conduction between the reset signal line Vinit and the anode of the light-emitting element L1 in response to the reset control signal.

Both a gate electrode of the first data write transistor T5 and a gate electrode of the second data write transistor T6 may be coupled to a gate electrode drive line GATE. A source electrode of the first data write transistor T5 may be coupled to the drain electrode of the drive transistor T7, and a drain electrode of the first data write transistor T5 may be coupled to the gate electrode of the drive transistor T7. A source electrode of the second data write transistor T6 may be coupled to a data signal line DATA, and a drain electrode of the second data write transistor T6 may be coupled to the source electrode of the drive transistor T7. The first data write transistor T5 may control the conduction/non-conduction between the drain electrode of the drive transistor T7 and the gate electrode of the drive transistor T7 in response to a gate electrode drive signal supplied by the gate electrode drive line GATE. The second data write transistor T6 may control the conduction/non-conduction between the data signal line DATA and the source electrode of the drive transistor T7 in response to the gate electrode drive signal.

The drive transistor T7 may transmit a driving current to the third node N3 based on a potential of the first node N1 and a potential of the second node N2. In the case that the second light-emitting control transistor T2 controls the drain electrode of the drive transistor T7 and the anode of the light-emitting element L1 to be conducted, a potential of the third node N3 may be further transmitted to the anode of the light-emitting element L1 through the second light-emitting control transistor T2, such that the light-emitting element L1 emits light.

It should be noted that the first light-emitting control transistor T1 and the second light-emitting control transistor T2 may be collectively referred to as a light-emitting control transistor. The first reset transistor T3 and the second reset transistor T4 may be collectively referred to as a reset transistor. The first data write transistor T5 and the second data write transistor T6 may be collectively referred to as a data write transistor. In addition, in combination with the structure shown in FIG. 1, it can be known that the pixel circuit according to the embodiments of the present disclosure may be a 7T1C structure (i.e., including 7 transistors and 1 capacitor). However, the pixel circuit is not limited to the 7T1C structure, and the pixel circuits of other structures may further be applicable to the embodiments of the present disclosure on the premise of no conflict. Moreover, in the structure shown in FIG. 1, the transistors are P-type transistors. And, the transistors may also be N-type transistors. Alternatively, a part of transistors are N-type transistors and the other part of transistors are P-type transistors.

Figure 2:
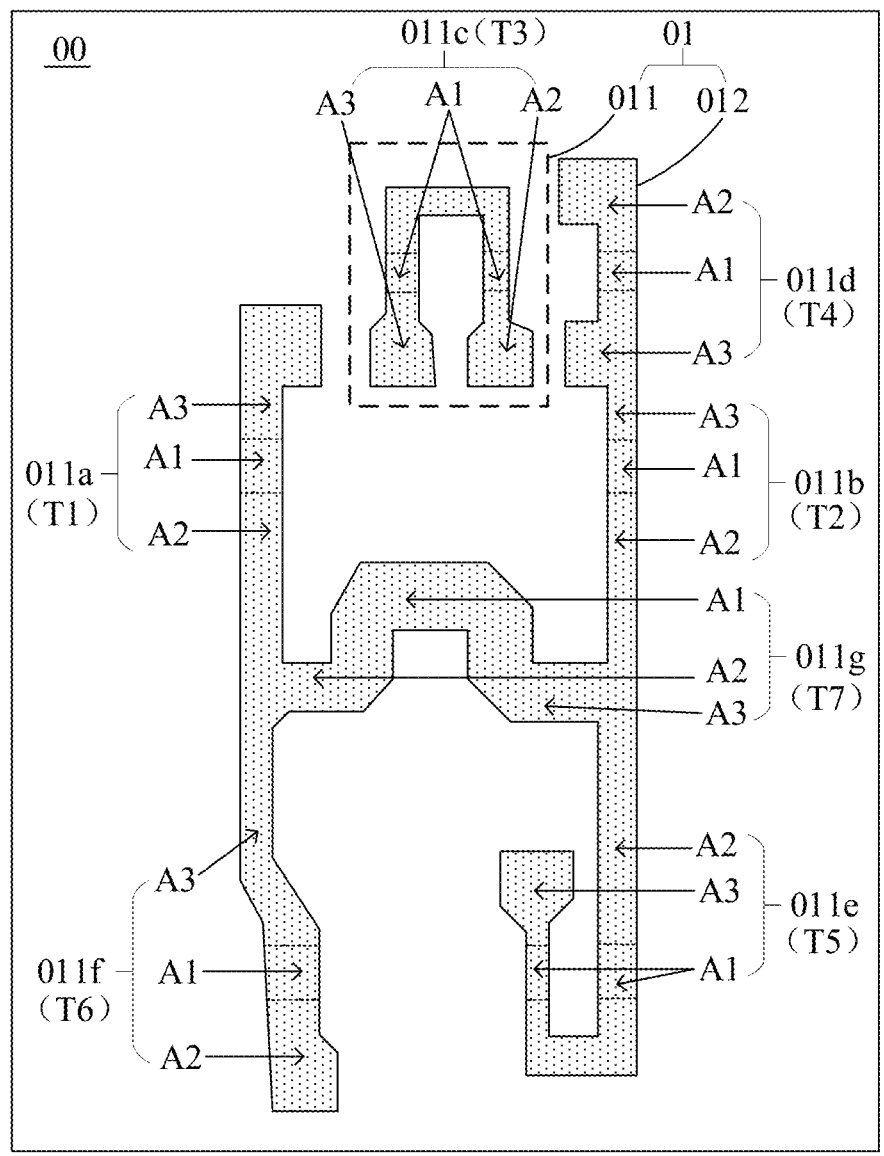
FIG. 2 is a schematic structural diagram of a semiconductor layer in a pixel circuit according to an embodiment of the present disclosure.

By taking the structure of the pixel circuit shown in FIG. 1 as an example, FIG. 2 shows a schematic structural diagram of another pixel circuit. As shown in FIG. 2, the pixel circuit may include a semiconductor layer 01 on a side of a base substrate 00. The semiconductor layer 01 may be configured to form an active layer of each of various transistors in the pixel circuit.

In order to distinguish the active layers of different transistors, in combination with FIG. 2, the active layer of the first light-emitting control transistor T1 may be marked as 011a, the active layer of the second light-emitting control transistor T2 may be marked as 011b; the active layer of the first reset transistor T3 may be marked as 011c, the active layer of the second reset transistor T4 may be marked as 011d; the active layer of the first data write transistor T5 may be marked as 011e, the active layer of the second data write transistor T6 may be marked as 011f, and the active layer of the drive transistor T7 may be marked as 011g. In addition, referring to FIG. 2, an orthographic projection of the active layer formed by the semiconductor 01 on the base substrate 00 is curved. The active layers of the transistors, other than the active layer 011c of the first reset transistor T3, is in an integral structure. That is, the active layer 011c of the first reset transistor T3 and the active layers of the other transistors are spaced apart. In addition, both the active layer 011e of the first data write transistor T5 and the active layer 011c of the first reset transistor T3 include two channel regions A1. In other words, both the first data write transistor T5 and the first reset transistor T3 are double-gate electrode transistors. The same applies to the drawing of the following embodiments.

Still referring to FIG. 2, the active layer of each transistor may include a channel region A1, and a source electrode region A2 and a drain electrode region A3 that are disposed on both sides of the channel region A1. The channel region A1 may not be doped, or may have a different doping type from the source electrode region A2 and the drain electrode region A3, and thus possesses semiconductor characteristics. Both the source electrode region A2 and the drain electrode region A3 may be doped and thus possess conductivity. Doped impurities may vary according to the type (i.e., N-type or P-type) of the transistor. Moreover, for each transistor, the source electrode thereof may be coupled to the source electrode region A2, and the drain electrode thereof may be coupled to the drain electrode region A3.

Figure 3:
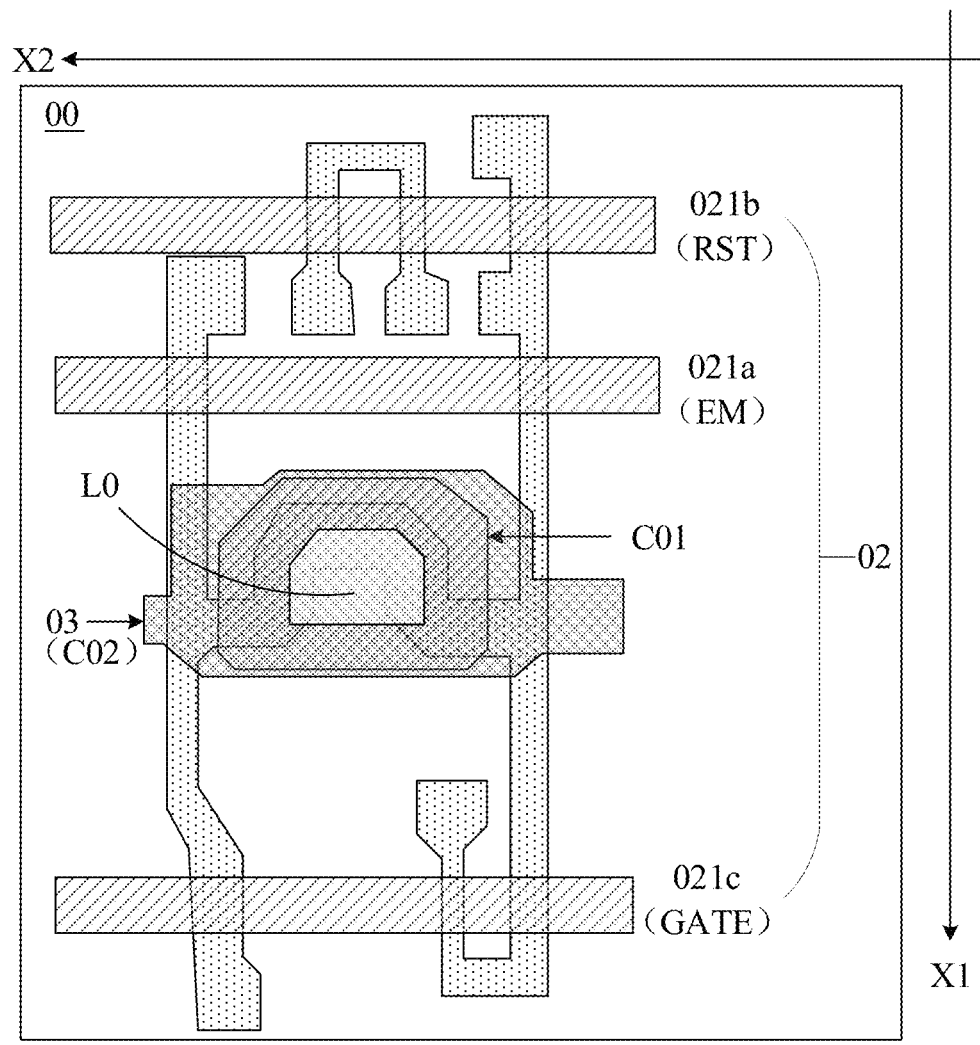
FIG. 3 is a schematic diagram of a partial hierarchical structure in a pixel circuit according to an embodiment of the present disclosure.

FIG. 3 is a schematic structural diagram of another pixel circuit according to an embodiment of the present disclosure. As shown in FIG. 3, the pixel circuit may further include a first metal layer 02 on the side of the base substrate 00. The first metal layer 02 may be configured to form a gate electrode of the transistor and a first capacitive electrode C01 of the storage capacitor C0.

In order to distinguish the gate electrodes of different transistors, in combination with FIG. 3, in the following embodiment, the gate electrodes of the light-emitting control transistors (including the first light-emitting control transistor T1 and the second light-emitting control transistor T2) are marked as 021a, the gate electrodes of the reset transistors (including the first reset transistor T3 and the second reset transistor T4) are marked as 021b, and the gate electrodes 021 of the data write transistors (including the first data write transistor T5 and the second data write transistor T6) are marked as 021*c*.

Referring to FIG. 2 and FIG. 3 that, for each transistor, an overlap region is present between the gate electrode thereof and the channel region A1 thereof. That is, an orthographic projection of the gate electrode 021 on the base substrate 00 is at least partially overlapped with an orthographic projection of the channel region A1 on the base substrate 00.

In combination with FIG. 1, the gate electrode 021*a* of the light-emitting control transistor may be configured to receive a light-emitting control signal, that is, the gate electrode 021*a* of the light-emitting control transistor may be the light-emitting control line EM. The gate electrode 021*b* of the reset transistor may be configured to receive a reset control signal, that is, the gate electrode 021*b* of the reset transistor may be the reset control line RST. The gate electrode 021*c* of the data write transistor may be configured to receive a gate electrode drive signal, that is, the gate electrode 021*c* of the data write transistor may be the gate electrode drive line GATE.

Still referring to FIG. 3, that the pixel circuit may further include a second metal layer 03 on the side of the base substrate. The second metal layer 03 may be configured to form a second capacitive electrode C02 of the storage capacitor C0. The second capacitive electrode C02 is at least partially overlapped with the first capacitive electrode C0L and the overlap portion may form the storage capacitor C0. Furthermore, referring to FIG. 1 and FIG. 3, the second capacitive electrode C02 is coupled to the drive power line ELVDD (not shown in FIG. 3) extending along a first direction X1.

Figure 4:
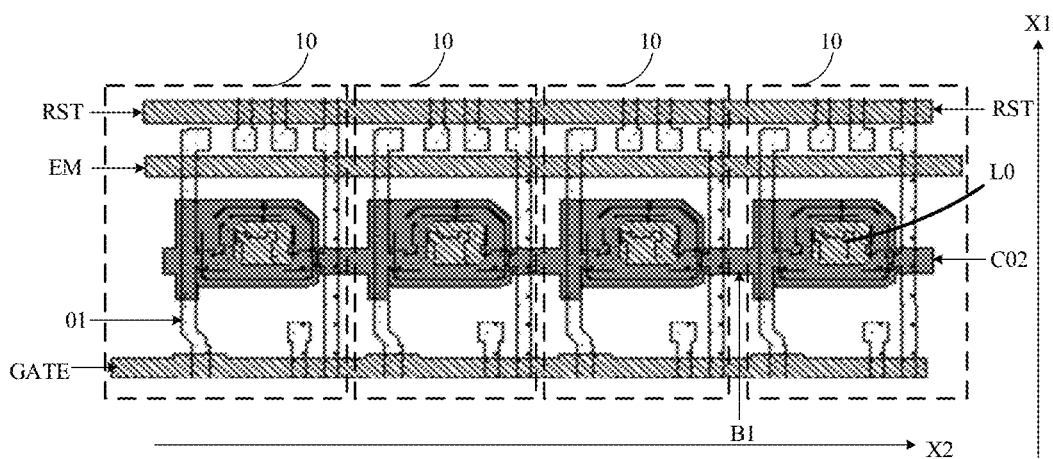
FIG. 4 is a schematic diagram of a partial hierarchical structure of a pixel circuit according to an embodiment of the present disclosure.

By taking the above accompanying drawing as an example, FIG. 4 shows a schematic structural diagram of another pixel circuit. As shown in FIG. 4, the gate electrodes (i.e., the first metal layer 02) of the transistors and the storage capacitor C0 may be sequentially arranged along the first direction X1. The second capacitive electrodes C02 of each two adjacent pixel circuits may be coupled via a connection portion B1 along a second direction X2. The connection portion B1 is overlapped with the data signal line DATA (not shown in FIG. 4) extending along the first direction.

Optionally, the connection portion B1 and the second metal layer 02 may be disposed on the same layer, and the connection portion B1 is parallel to the channel region A1 of at least one transistor (for example, the drive transistor T7). The first direction X1 may be perpendicular to the second direction X2. For example, the first direction may be a row direction, and the second direction may be a column direction.

The phrase "disposed on the same layer" may refer to a layer structure by patterning a film layer with the same mask through a single patterning process, wherein the film layer is formed by the same film forming process and is configured to form a specific pattern. According to different specific patterns, a patterning process may include multiple exposure, development or etching processes, and the specific pattern in the formed layer structure may be continuous or discontinuous. That is, multiple elements, components, structures and/or parts disposed on the "same layer" are made of the same material and formed by the same patterning process.

In summary, the embodiment of the present disclosure provides a pixel circuit. The semiconductor layer in the pixel circuit can form the active layer of each of various transistors, the first metal layer in the pixel circuit can form the gate electrode of the transistor and the first capacitive electrode of the storage capacitor, and the second metal layer in the pixel circuit can form the second capacitive electrode of the storage capacitor. The second capacitive electrode is coupled to the drive power line. In addition, along a target direction, the second capacitive electrodes of each two adjacent pixel circuits are coupled to each other, thereby ensuring better working stability of each pixel circuit.

Optionally, referring to FIG. 1 and FIG. 2, the semiconductor layer 01 described in the embodiments of the present disclosure may include a first semiconductor pattern 011 and a second semiconductor pattern 012 that are spaced apart. Both the first semiconductor pattern 011 and the second semiconductor patterns 012 may be coupled to the reset signal line RST. The term "spaced apart" may refer to that two elements are disposed independently and in non-contact.

The first semiconductor pattern 011 may be configured to form the active layer 011*c* of the first reset transistor T3. The second semiconductor pattern 012 may be configured to form the active layers of the transistors other than the first reset transistor T3, that is, 011*a*, 011*b*, 011*d*, 011*e*, 011*f*, and 011*g* shown in FIG. 2.

Optionally, in the embodiments of the present disclosure, the coupled part of the second capacitive electrode C02 and the drive power line ELVDD may be not overlapped with the semiconductor layer 01. In this way, the signal interference can be avoided.

Optionally, referring to FIG. 3 and FIG. 4, an orthographic projection of the first capacitive electrode C01 on the base substrate 00 may be in a substantially rectangular shape. The term "substantially rectangular" may include a rectangle, a rectangle with at least one rounded corner, a rectangle with at least one chamfered corner, and the like. The second capacitive electrode C02 (i.e., the second metal pattern 032) may include a hollowed region L0. In combination with FIG. 1, as the first capacitive electrode C01 further needs to be coupled to the gate electrode of the drive transistor T0, the hollowed region L0 in the second capacitive electrode C02 can facilitate effective coupling of the first capacitive electrode C01 under the second capacitive electrode C02 and the part needing to be coupled.

Optionally, an orthographic projection of the hollow region L0 described above on the base substrate 00 may be in a substantially rectangular shape. The phrase "substantially rectangular" may include the rectangle or square, the rectangle or square with at least one rounded corner, the rectangle or square with at least one chamfered corner, and the like.

Optionally, referring to FIG. 3, in the embodiments of the present disclosure, the gate electrode 021*a* of the light-emitting control transistor may be disposed between the gate electrode 021*b* of the reset transistor and the gate electrode 021*c* of the data write transistor. That is, in combination with FIG. 1, the light-emitting control line EN may be disposed between the reset control line RST and the gate electrode drive line GATE.

Optionally, still referring to FIG. 3, along the first direction X1, the gate electrode 021*b* of the reset transistor and the gate electrode 021*c* of the data write transistor may be disposed on both sides of the storage capacitor C0.

Optionally, still referring to FIG. 3, along the first direction X1, the gate electrode 021*b* of the reset transistor and the gate electrode 021*a* of the light-emitting control transistor may be disposed on both sides of the storage capacitor C0. In this way, it is convenient for concentrated distribution of the reset control line and coupling of the light-emitting control line on the base substrate, thereby decreasing an area of the base substrate occupied by the pixel circuit, and improving a resolution of the display panel.

Figure 5:
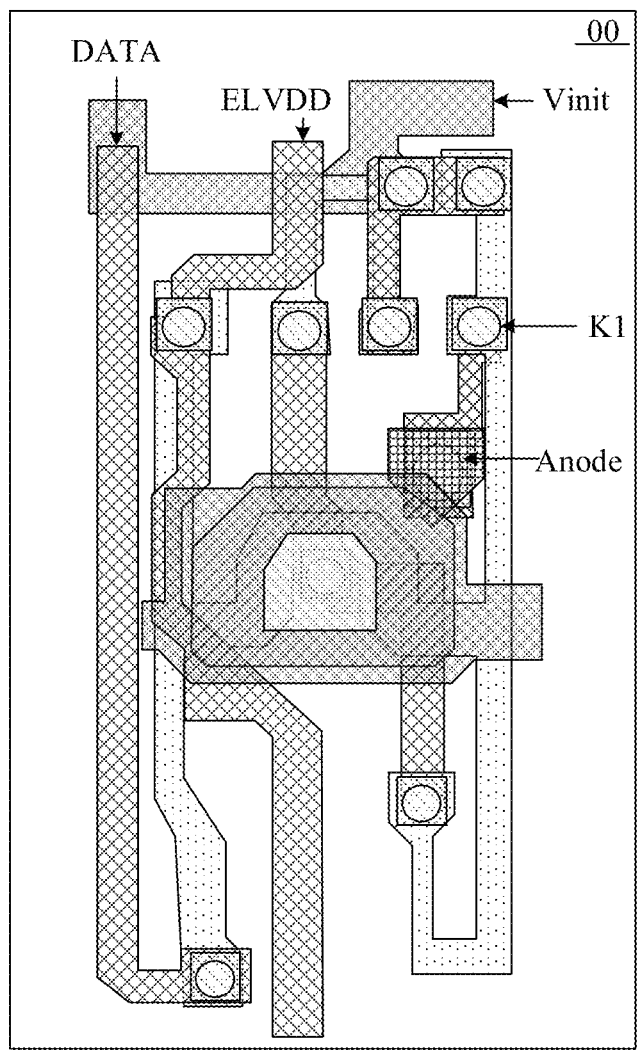
FIG. 5 is a schematic diagram of a partial hierarchical structure of a pixel circuit according to an embodiment of the present disclosure.

Optionally, FIG. 5 is a schematic structural diagram of still another pixel circuit according to an embodiment of the present disclosure. Referring to FIG. 1 to FIG. 5, both the gate electrode 021 of the first data write transistor T5 and the gate electrode 021 of the second data write transistor T6 may be coupled to the gate electrode drive line GATE. The drain electrode region A3 of the first data write transistor T5 may be coupled to the drain electrode region A3 of the drive transistor T7, and the source electrode region A2 of the first data write transistor T5 may be coupled to the gate electrode 021 of the drive transistor T7. The drain electrode region A3 of the second data write transistor T6 may be coupled to the source electrode region A2 of the drive transistor T7, and the source electrode region A2 of the second data write transistor T6 may be coupled to the data signal line DATA.

Both the gate electrode 021a of the first light-emitting control transistor T1 and the gate electrode 021a of the second light-emitting control transistor T2 may be coupled to the light-emitting control line EM. The drain electrode region A3 of the first light-emitting control transistor T1 may be coupled to the source electrode region A2 of the drive transistor T7. The source electrode region A2 of the first light-emitting control transistor T1 may be coupled to the drive power line ELVDD. The drain electrode region A3 of the second light-emitting control transistor T2 may be coupled to the anode of the light-emitting element L1. The source electrode region A2 of the second light-emitting control transistor T2 may be coupled to the drain electrode region A3 of the drive transistor T7.

Both the gate electrode 021b of the first reset transistor T3 and the gate electrode 021b of the second reset transistor T4 may be coupled to the reset control line RST. Both the source electrode region A2 of the first reset transistor T3 and the source electrode region A2 of the second reset transistor T4 may be coupled to the reset signal line Vinit. The drain electrode region A3 of the first reset transistor T3 may be coupled to the gate electrode 021d of the drive transistor T7, and the drain electrode region A3 of the second reset transistor T4 may be coupled to the anode of the light-emitting element L1.

Optionally, both the active layer 011e of the first data write transistor T5 and the active layer 011c of the first reset transistor T3 described in the embodiments of the present disclosure may include at least two bent portions.

For example, referring to FIG. 2 and FIG. 3, in the shown pixel circuit, both the active layer 011e of the first data write transistor T5 and the active layer 011c of the first reset transistor T3 include two bent portions. That is, both an orthographic projection of the active layer 011e of the first data write transistor T5 on the base substrate 00 and an orthographic projection of the active layer 011c of the first reset transistor T3 on the base substrate 00 are U-shaped.

In the U-shaped active layer, an extending direction of the source electrode region A2 and an extending direction of the drain electrode region A3 may be parallel, an extending direction of the channel region A1 and the extending direction of the source electrode region A2 may be intersected with each other, and the extending direction of the channel region A1 and the extending direction of the drain electrode region A3 may be intersected with each other. That is, the source electrode region A2 and the drain electrode region A3 may extend along two opposite directions with respect to the channel region A1.

For example, referring to FIG. 2 and FIG. 3, in the shown U-shaped active layer, both the extending direction of the source electrode region A2 and the extending direction of the drain electrode region A3 are the first direction X1, and the extending direction of the channel region A1 is the second direction X2. That is, the extending direction of the channel region A1 and the extending direction of the source electrode region A2 are perpendicular to each other, and the extending direction of the channel region A1 and the extending direction of the drain electrode region A3 are perpendicular to each other.

In some embodiments, the active layer 011e of the first data write transistor T5 and the active layer 011c of the first reset transistor T3 may further include more than two bent portions. For example, for the active layer with four bent portions, the orthographic projection thereof on the base substrate 00 may be S-shaped.

The active layer 011e of the first data write transistor T5 and the active layer 011c of the first reset transistor T3 include at least two bent portions, such that the first data write transistor T5 and the first reset transistor T3 occupy a smaller area of the base substrate 00. In this way, each pixel circuit is further prevented from occupying a larger area of the base substrate, and a higher resolution of the display panel is ensured. In addition, the active layer 011e of the first data write transistor T5 and the active layer 011c of the first reset transistor T3 merely include two bent portions, namely U-shaped bent portions, such that it can be further ensured that the first data write transistor T5 and the first reset transistor T3 occupy a smaller area of the base substrate 00, and the manufacturing process is simple.

Figure 6:
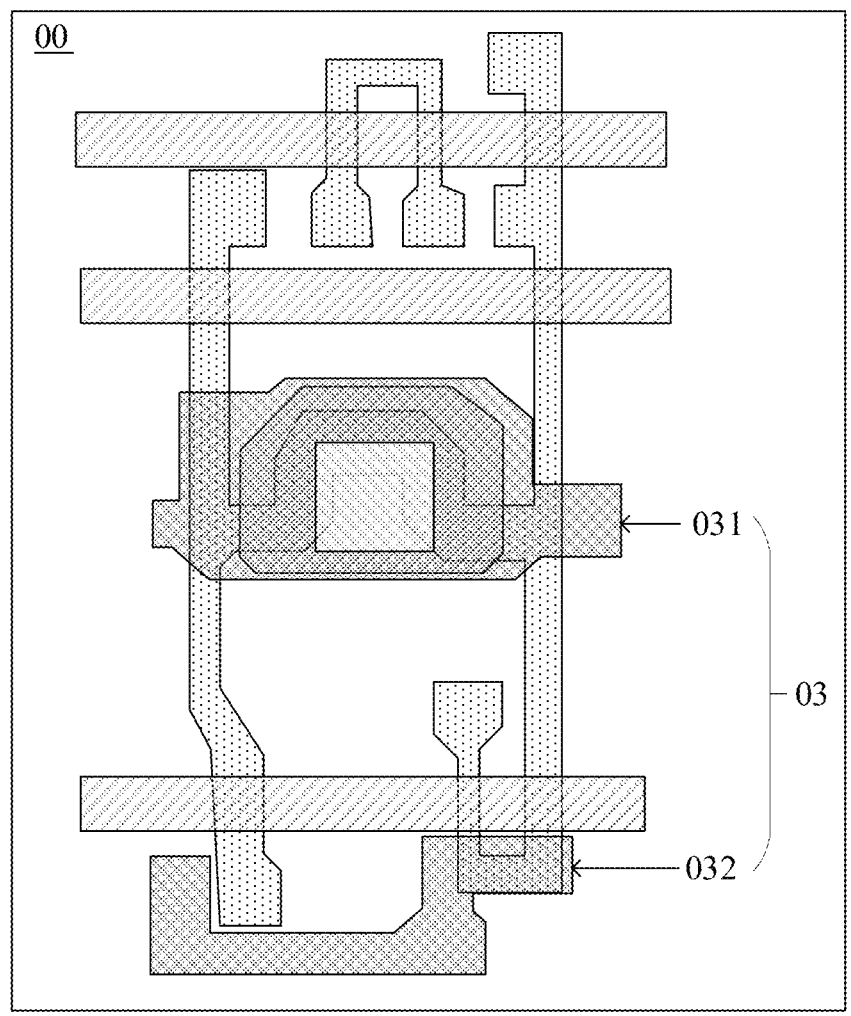
FIG. 6 is a schematic diagram of a partial hierarchical structure of a pixel circuit according to an embodiment of the present disclosure.

Optionally, FIG. 6 is a schematic structural diagram of still another pixel circuit according to an embodiment of the present disclosure. As shown in FIG. 6, the second metal layer 03 may include a first metal pattern 031 and a second metal pattern 032 that are spaced apart.

Referring to FIG. 3, the first metal pattern 031 may be configured to form the second capacitive electrode C02, and the second metal pattern 032 may be partially overlapped with the active layer 011e of the first data write transistor T5.

Optionally, referring to FIG. 6, the second metal pattern 032 may be not overlapped with the gate electrode 021c of the first data write transistor T5. In other words, in the active layer 011e of the first data write transistor T5, the second metal pattern 032 is further disposed to shield the part not overlapped with the gate electrode 021c.

Optionally, referring to FIG. 5 and FIG. 6, the overlap portion of the second metal pattern 032 and the active layer 011e of the first data write transistor T5 may also be the part, proximal to the gate electrode of the drive transistor T7, that is, proximal to the first node N1, in the active layer 011e of the first data write transistor T5. In this way, a potential of the gate electrode of the drive transistor T7 can be effectively stabilized by the second metal pattern 032.

Figure 7:
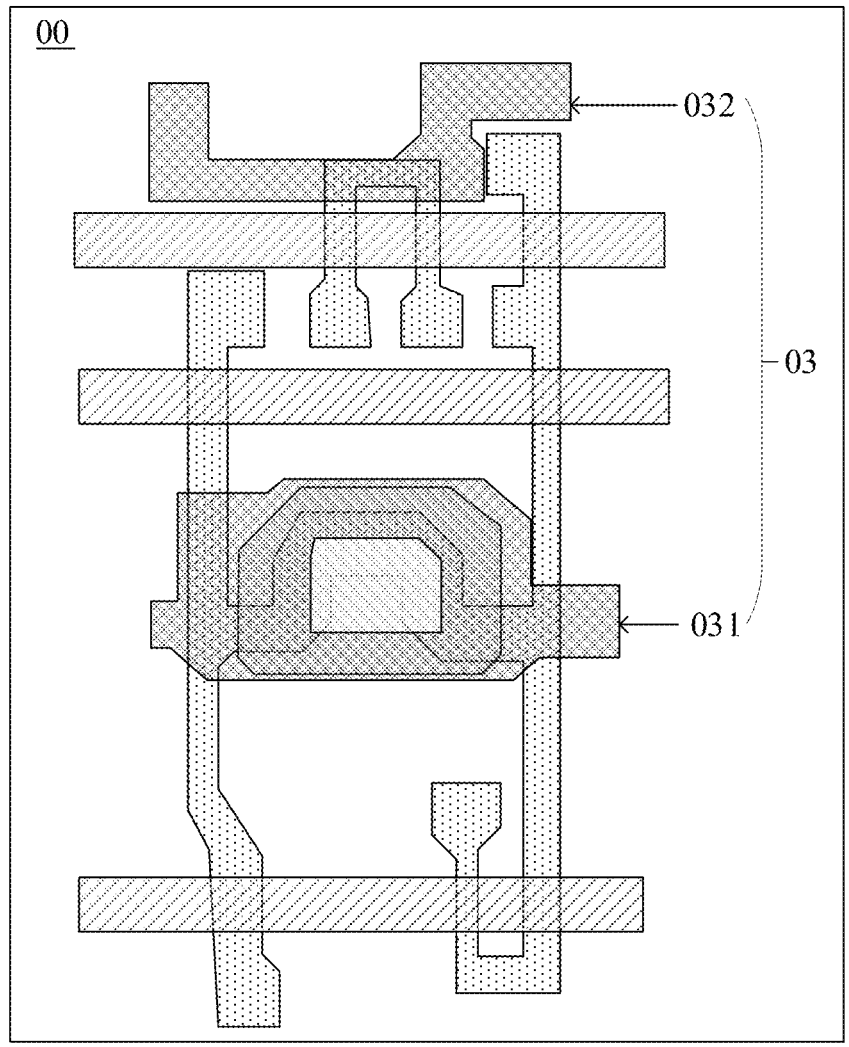
FIG. 7 is a schematic diagram of a partial hierarchical structure of a pixel circuit according to an embodiment of the present disclosure.

Optionally, FIG. 7 is a schematic structural diagram of still another pixel circuit according to an embodiment of the present disclosure. As shown in FIG. 7, the second metal pattern 032 may be further partially overlapped with the active layer 011c of the first reset transistor T3.

As in FIG. 6, the second metal pattern 032 may be further not overlapped with the gate electrode 021b of the first reset transistor T3. In other words, in the active layer 011c of the first reset transistor T3, the second metal pattern 032 is further disposed to shield the part not overlapped with the gate electrode 021b.

Optionally, referring to FIG. 5 and FIG. 7, the overlap portion of the second metal pattern 032 and the active layer 011c of the first reset transistor T3 may also be the part, proximal to the gate electrode of the drive transistor T7, that is, proximal to the first node N1, in the active layer 011c of the first reset transistor T3. In this way, the potential of the gate electrode of the drive transistor T7 can be further effectively stabilized by the second metal pattern 032.

Figure 8:
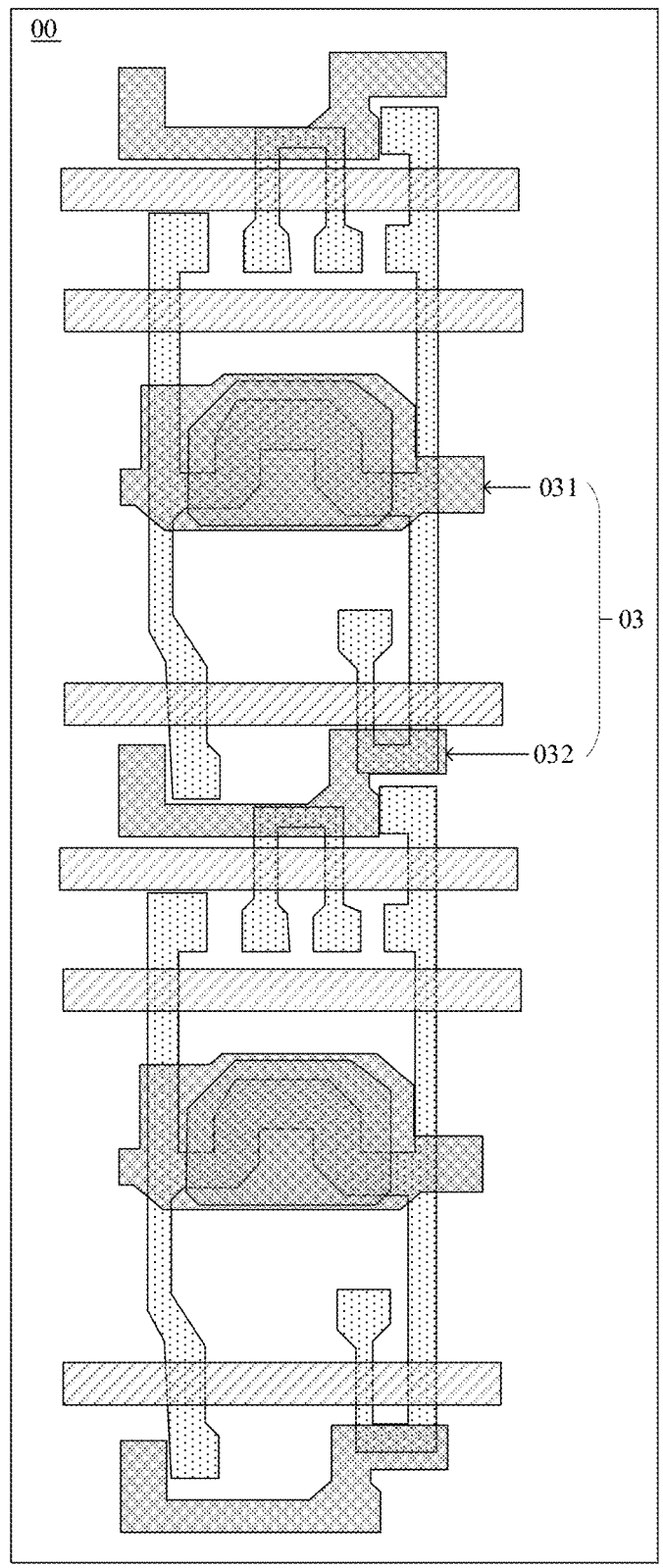
FIG. 8 is a schematic diagram of a partial hierarchical structure of a pixel circuit according to an embodiment of the present disclosure.

FIG. 8 shows two adjacent pixel circuits in the same column. Referring to FIG. 8, the second metal pattern 032 is overlapped with both the active layer 011e of the first data write transistor T5 and the active layer 011c of the first reset transistor T3. Referring to FIG. 8, the second metal pattern 032 is overlapped with the connection portion between the two channel regions A1 in the active layers.

Optionally, referring to FIG. 5, the second metal pattern 032 described in the embodiments of the present disclosure may be configured to receive a reset signal. In other words, the second metal pattern 032 may serve as the reset signal line Vinit. That is, in the embodiments of the present disclosure, the reset signal supplied by the reset signal line Vinit may be configured to stabilize the potential of the gate electrode of the drive transistor T7.

Figure 9:
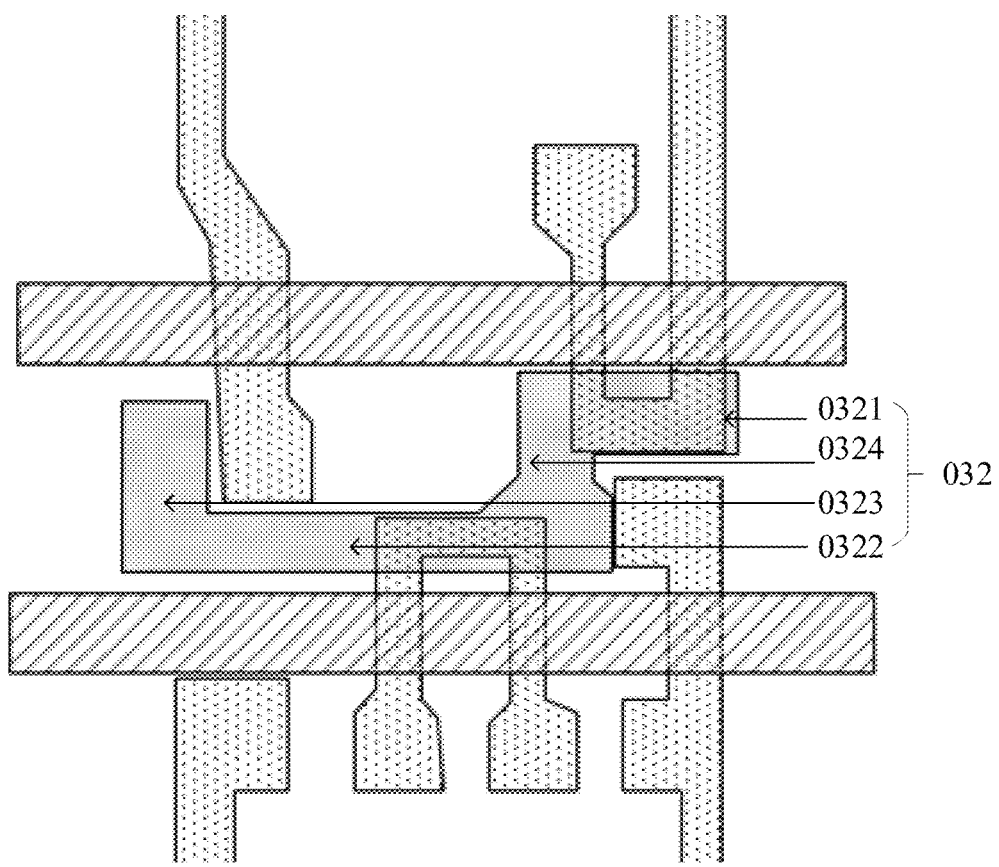
FIG. 9 is a partial enlarged view of a pixel circuit according to an embodiment of the present disclosure.

Optionally, by taking the structure shown in FIG. 8 as an example, FIG. 9 shows an enlarged schematic diagram of the second metal pattern 032. Referring to FIG. 3 and FIG. 9, the second metal pattern 032 may include a first extending region 0321 and a second extending region 0322. An extending direction of the first extending region 0321 and an extending direction of the second extending region 0322 may be parallel, for example, may be the second direction X2.

The first extending region 0321 may be overlapped with the active layer 011e of the first data write transistor T5. In addition, in combination with FIG. 5, an extending line of the first extending region 0321 is overlapped with the coupled part of the second data write transistor T6 and the data signal line DATA. The second extending region 0322 may be overlapped with the active layer 011c of the first reset transistor T3.

Optionally, still referring to FIG. 9, the second metal pattern 032 may further include a first connection region 0323 and a second connection region 0324.

An extending direction of the first connection region 0323 and the extending direction of the second extending region 0322 may be intersected with each other, the extending direction of the second extending region 0322 and an extending direction of the second connection region 0324 may be intersected with each other, the extending direction of the second connection region 0324 and the extending direction of the first extending region 0321 may be intersected with each other, and the first connection region 0323, the first extending region 0321, the second connection region 0324, and the second extending region 0322 may be sequentially connected.

For example, referring to FIG. 9, the shown first connection region 0323 is perpendicular to the first extending region 0321, the second connection region 0324 is perpendicular to the second extending region 0322, and the first extending region 0321 is parallel to the second extending region 0322. In addition, referring to FIG. 5, the first connection region 0323 may be overlapped with the data signal line DATA.

An orthographic projection of the second metal pattern 032 on the base substrate 00 shown in FIG. 9 is S-shaped. In some embodiments, the second metal pattern 032 may further be other shapes, for example, a "zigzag" shape.

Figure 10:
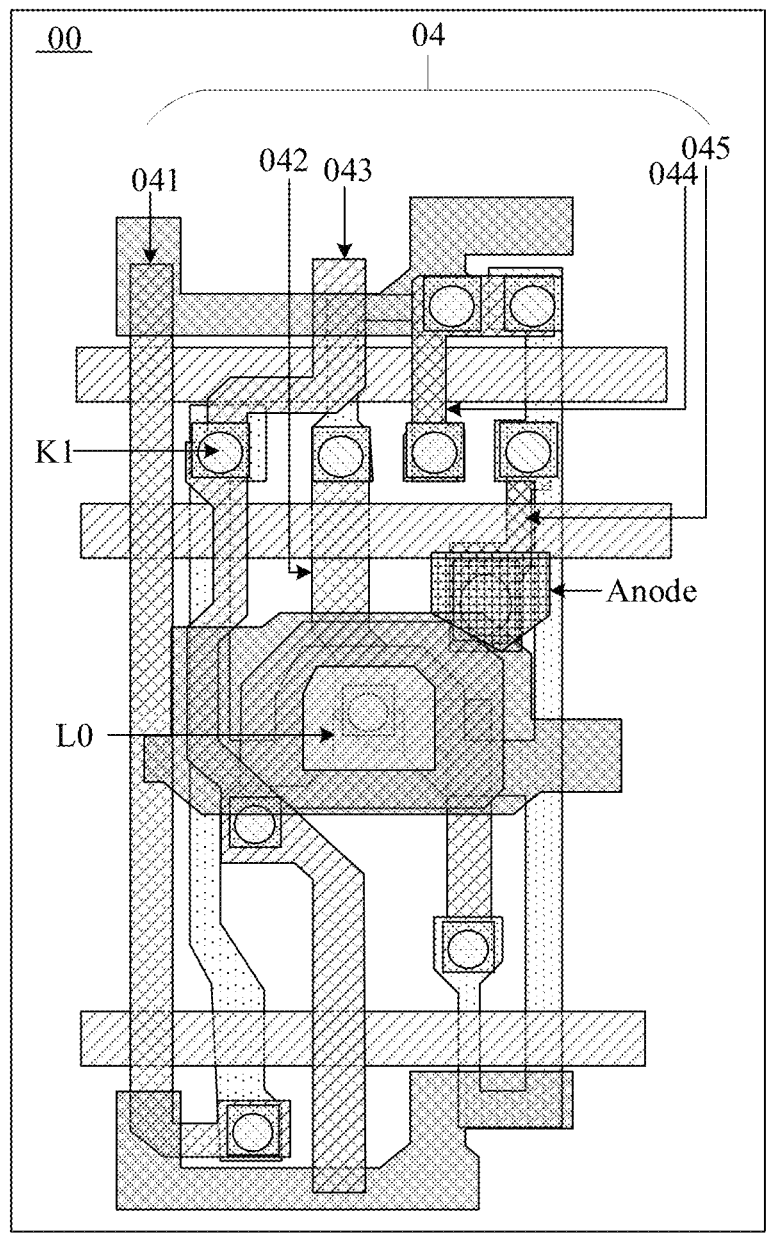
FIG. 10 is a schematic diagram of a partial hierarchical structure in a pixel circuit according to an embodiment of the present disclosure.

Optionally, FIG. 10 is a schematic structural diagram of still another pixel circuit according to an embodiment of the present disclosure. As shown in FIG. 10, the pixel circuit may further include a third metal layer 04 on the side of the base substrate 00.

The third metal layer 04 may be configured to form the source electrode and drain electrode of the transistor. For each transistor, the source electrode thereof may be coupled to the source electrode region A2 of the active layer, and the drain electrode thereof may be coupled to the drain electrode region A3 of the active layer.

Optionally, the third metal layer 04 may include a first metal block 041, a second metal block 042, a third metal block 043, a fourth metal block 044, and a fifth metal block 045 that are spaced apart.

The first metal block 041 may be configured to receive a data signal. In other words, in combination with FIG. 5, the first metal block 041 may be the data signal line. The second metal block 042 may be configured to receive a drive power signal. In other words, in combination with FIG. 5, the second metal block 042 may be the drive power line ELVDD. The drain electrode region A3 of the first reset transistor T3 and the drain electrode region A3 of the first data write transistor T5 may be coupled to the gate electrode of the drive transistor T7 through the third metal block 043. The source electrode region A2 of the first reset transistor T3 and the source electrode region A2 of the second reset transistor T4 may be coupled to the reset signal line Vinit through the fourth metal block 044. The drain electrode region A3 of the second reset transistor T4 and the source electrode region A2 of the second light-emitting control transistor T2 may be coupled to the anode of the light-emitting element L1 through the fifth metal block 045.

It should be noted that the parts in different layers and coupled to each other may be coupled through a via hole K1. For example, in combination with FIG. 5 and FIG. 10, it can be known that the second data write transistor T6 may be coupled to the data signal line DATA (i.e., the first metal block 041) through one via hole K1. As shown in FIG. 9 the extending line of the first extending region 0321 is overlapped with the coupled part of the second data write transistor T6 and the data signal line DATA may refer to that the extending line of the first extending region 0321 is coupled to the via hole K1.

The first light-emitting control transistor T1 may be coupled to the drive power line ELVDD (i.e., the second metal block 042) through one via hole K1. The second capacitive electrode C02 may be coupled to the drive power line ELVDD through one via hole K1.

The gate electrode of the drive transistor T7 may be coupled to the middle part of the third metal block 043 through one via hole K1, and the drain electrode region A3 of the first reset transistor T3 may be coupled to one end of the third metal block 043 through one via hole K1. The drain electrode region A3 of the first data write transistor T5 may be coupled to the other end of the third metal block 043 through one via hole K1.

The anode of the light-emitting element L1 may be coupled to one end of the fifth metal block 045 through one via hole K1, and the drain electrode region A3 of the second reset transistor T4, and the drain electrode region A3 of the second light-emitting control transistor T2 may be coupled to the other end of the fifth metal block 045 through the same via hole K1.

The source electrode region A2 of the first reset transistor T3 and the source electrode region A2 of the second reset transistor T4 are coupled to the reset signal line Vinit through three via holes K1.

Figure 11:
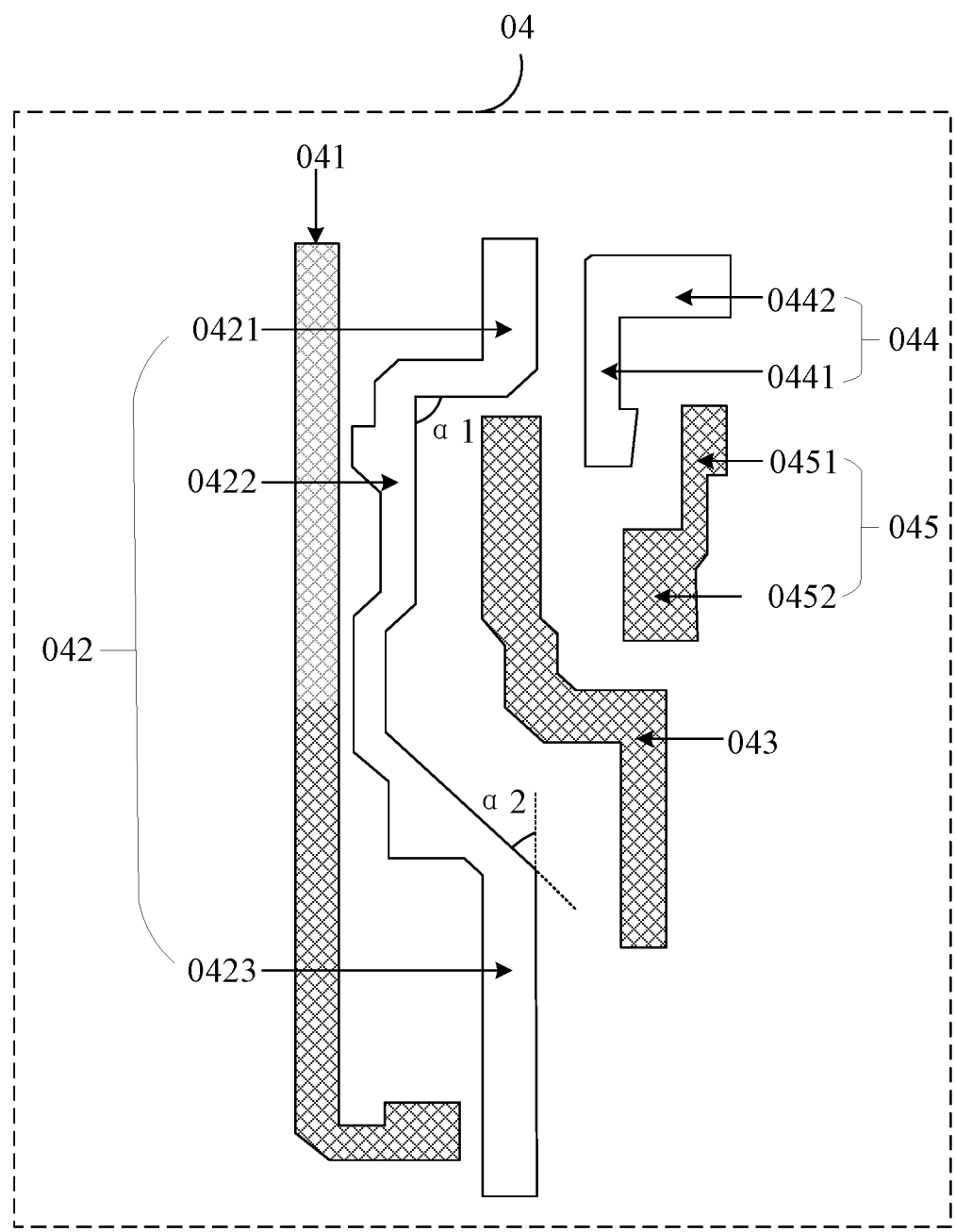
FIG. 11 is a schematic diagram of a structure only including a third metal layer according to an embodiment of the present disclosure.

Optionally, FIG. 11 is a schematic structural diagram of the third metal layer 04. Referring to FIG. 10 and FIG. 11, the second metal block 042 may include a first extending portion 0421 and a second extending portion 0422 that extend in sequence along the first direction X1 and are coupled to each other.

An included angle α1 between the first extending portion 0421 and the second extending portion 0422 may be less than or equal to 90 degrees, and the included angle α1 refers to an included angle toward the storage capacitor. For example, in the structure shown in FIG. 11, the included angle α1 between the first extending portion 0421 and the second extending portion 0422 is 90 degrees. That is, the first extending portion 0421 is perpendicular to the second extending portion 0422. In addition, an extending line of the first extending portion 0421 may be overlapped with the hollowed region L0 of the second capacitive electrode C02, and along the second direction X2, the second extending portion 0422 and the first metal block 041 (i.e., the data signal line DATA) may be disposed on the same side of the hollowed region L0.

Optionally, referring to FIG. 10 and FIG. 11, the second metal block 042 may further include a third extending portion 0423 extending along the first direction X1. The third extending portion 0423 may be coupled to the second extending portion 0422. An included angle α2 between the third extending portion 0423 and the second extending portion 0422 may be less than 90 degrees, and the included angle α2 also refers to an included angle toward the storage capacitor. For example, in the structure shown in FIG. 10, the included angle α2 between the third extending portion 0423 and the second extending portion 0422 is about 60 degrees. In addition, an extending line of the third extending portion 0423 may be also overlapped with the hollowed region L0 of the second capacitive electrode C02.

Optionally, referring to FIG. 11, both the first light-emitting control transistor T1 and the second capacitive electrode C02 are coupled to the second extending portion 0422. The first extending portion 0421 may be further partially overlapped with the active layer of the first reset transistor T3. For example, the first extending portion 0421 may be partially overlapped with one channel region A1 of the first reset transistor T3.

Optionally, referring to FIG. 10 and FIG. 11, that along the first direction X1, the third metal block 043 may be across the light-emitting control line EM, and may be further across span the storage capacitor C0, such that both the first reset transistor T3 and the first data write transistor T5 are effectively coupled to the gate electrode of the drive transistor T7 through the third metal block 043.

Optionally, referring to FIG. 10 and FIG. 11, the fourth metal block 044 may include a first conductive segment 0441 and a second conductive segment 0442.

In the same pixel circuit, the first conductive segment 0441 may be coupled to the source electrode region A2 of the first reset transistor T3, and the second conductive segment 0442 may be coupled to the source electrode region A2 of the second reset transistor T4.

The first conductive segment 0441 may extend along the first direction X1, the second conductive segment 0442 may extend along the second direction X2, and the first conductive segment 0442 may be across the reset signal line RST.

Optionally, referring to FIG. 10, the first conductive segment 0441 may be partially overlapped with the active layer of the second reset transistor T4.

By taking the coupling of the source electrode region A2 of the first reset transistor T3 and the source electrode region A2 of the second reset transistor T4 to the reset signal line Vinit via three via holes K1 described in the above embodiments as an example, referring to FIG. 10 and FIG. 11, the source electrode region A2 of the first reset transistor T3 may be coupled to an end of the first conductive segment 0441 through one via hole K1, the source electrode region A2 of the second reset transistor T4 may be coupled to an end of the second conductive segment 0442 through another via hole K1, and the first conductive segment 0441 and the second conductive segment 0442 are coupled to the reset signal line Vinit through the same via hole K1. In other words, the reset signal line Vinit is transmitted to the first reset transistor T3 and the second reset transistor T4 in two paths.

Optionally, referring to FIG. 10 and FIG. 11, the fifth metal block 045 may include a main body segment 0451 and an extending segment 0452.

Along the first direction X1, the fifth metal block 045 may be across the light-emitting control line EM, and the extending segment 0452 in the fifth metal block 045 may be overlapped with the light-emitting control line EM. In this way, the second reset transistor T4 and the second light-emitting control transistor T2 may be reliably coupled to the anode of the light-emitting element L1.

In this way, for the structure of the pixel circuit shown in FIG. 11, at least 10 via holes K1 need to be disposed. As the first metal layer 02, the second metal layer 03, and the third metal layer 04 are all disposed in different layers, effective coupling of each part can be ensured by forming the via holes. Optionally, the first metal layer 02 may also be referred to as a first gate electrode metal layer, the second metal layer 03 may also be referred to as a second gate electrode metal layer, and the third metal layer 04 may also be referred to as a source and drain electrode metal layer. In addition, in the embodiments of the present disclosure, an insulating layer is generally disposed between each two adjacent metal layers. Moreover, as the anode of the light-emitting element L1 is generally another metal layer independent of the metal layers described in the above embodiments, the insulating layer is further disposed between the anode of the light-emitting element L1 and the second metal block 042.

The insulating layer between the second metal layer 03 and the third metal layer 04 may be an inter-layer dielectric (ILD) layer. The insulating layer between the light-emitting element L1 and the third metal layer 04 may be a planarization layer (PLN) layer.

Optionally, in the embodiments of the present disclosure, the semiconductor layer 01 may be made of a semiconductor material such as low-temperature polysilicon, and a film layer thickness thereof may range from 400 to 800 angstroms, for example, 500 angstroms. The first metal layer 02 and the second metal layer 03 may be made of a conductive material such as molybdenum (Mo), and a film layer thickness thereof may range from 2000 to 4000 angstroms, for example, 3000 angstroms. The third metal layer 04 may be made of a conductive material such as titanium (Ti) and aluminum (Al). For example, the third metal layer 04 may be a laminated structure made of Ti, Al, and Ti in sequence, and a film layer thickness thereof may be range from 6000 to 9000 angstroms. The insulating layer, such as the inter-layer dielectric layer and the planarization layer, may be made of an insulating material such as silicon oxide, silicon nitride or silicon oxynitride, and a thickness of each layer may range from 1000 to 2000 angstroms.

Figure 12:
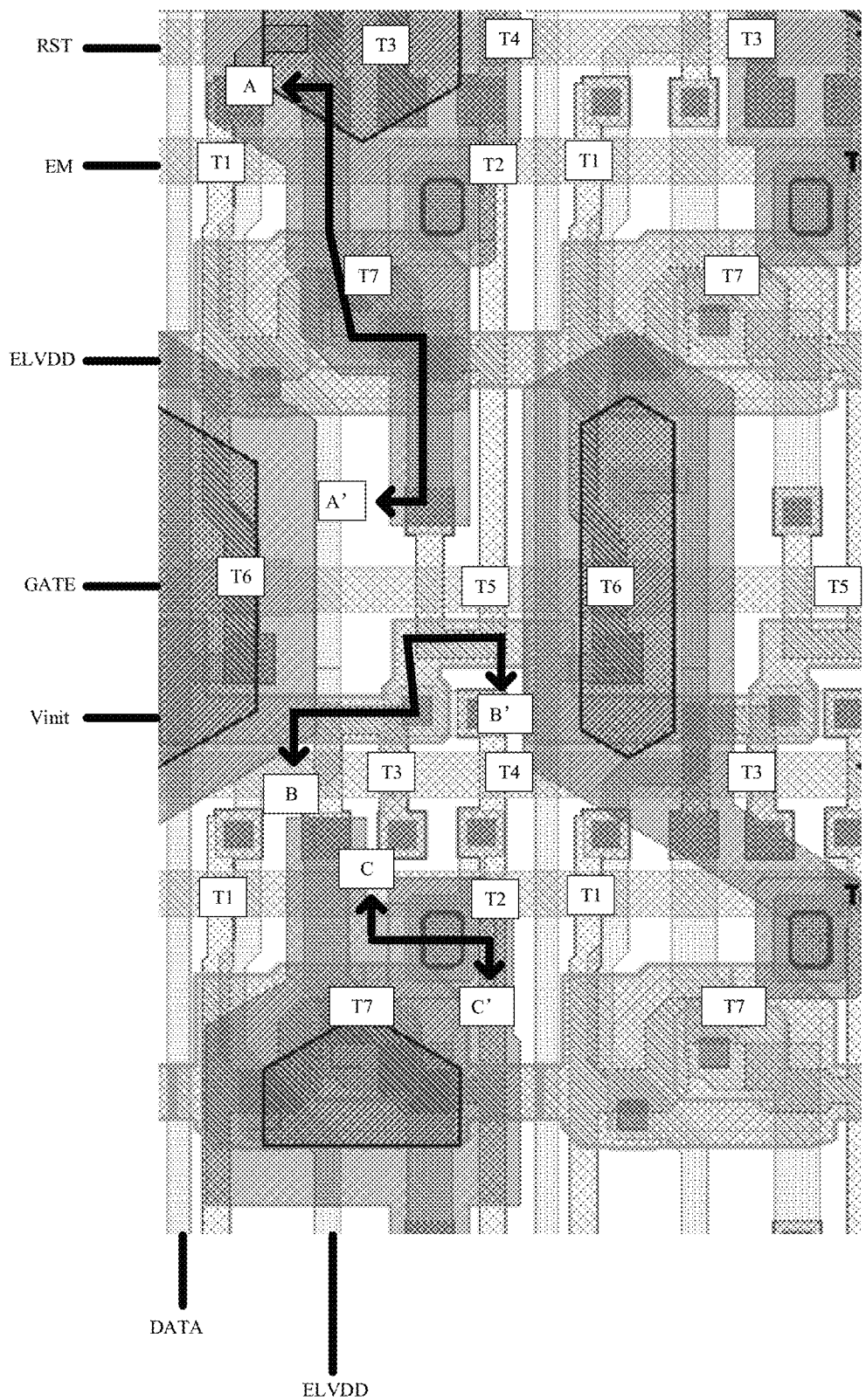
FIG. 12 is a schematic diagram of a complete structure of a pixel circuit according to an embodiment of the present disclosure.
Figure 13:
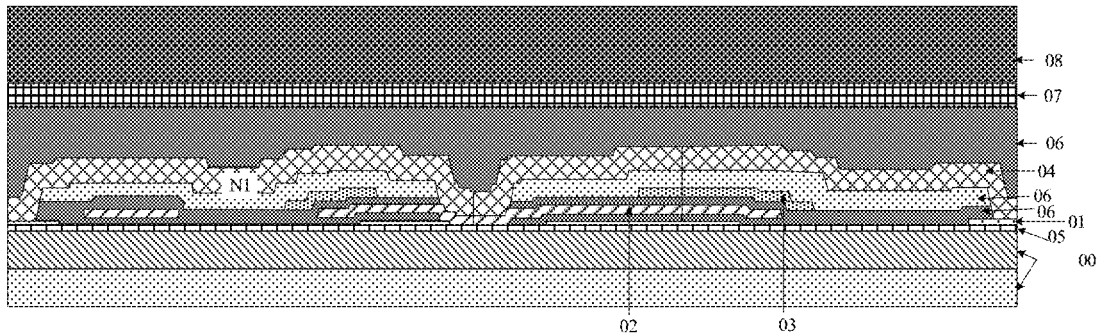
FIG. 13 is a cross-sectional view of a plane of AA' in FIG. 12.
Figure 14:
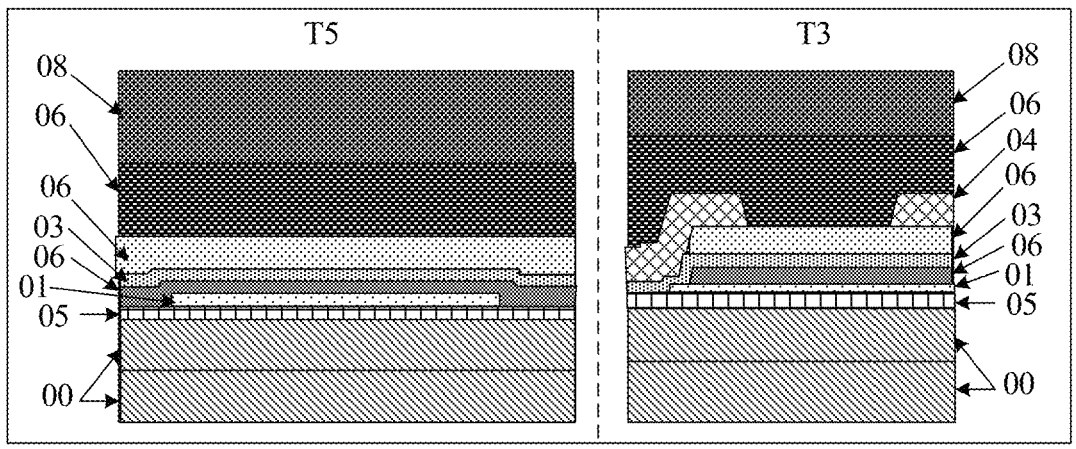
FIG. 14 is a cross-sectional view of a plane of BB' in FIG. 12.
Figure 15:
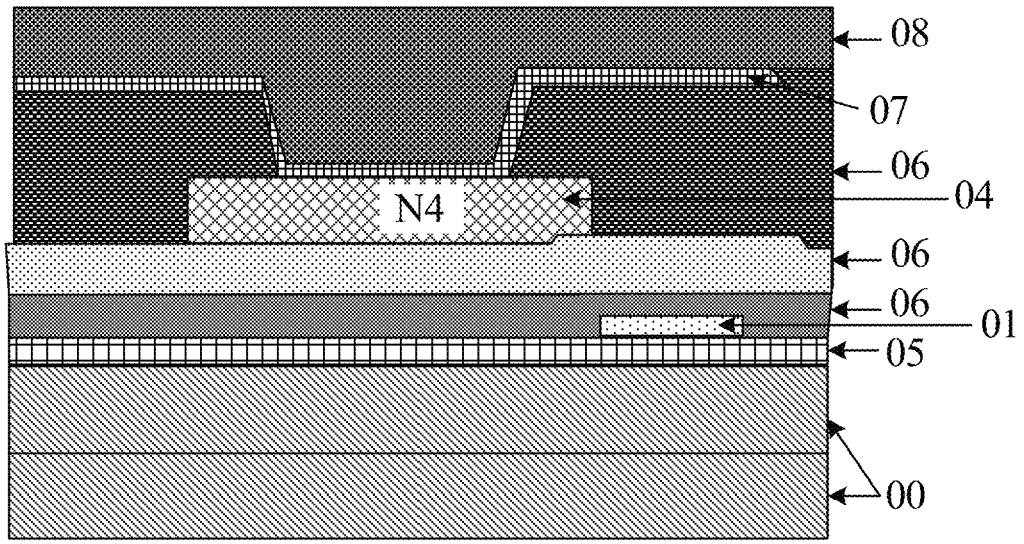
FIG. 15 is a cross-sectional view of a plane of CC' in FIG. 12.

Optionally, FIG. 12 shows a schematic diagram of a structure including a plurality of pixel circuits and light-emitting elements. FIG. 13 shows a cross-sectional view of the structure of a plane of AA' shown in FIG. 12. FIG. 14 shows a cross-sectional view of the structure shown of a plane of BB' in FIG. 12. FIG. 15 shows a cross-sectional view of the structure of a plane of CC' shown in FIG. 12.

Referring to FIG. 13 to FIG. 15, the pixel circuit may include a base substrate 00 which may be a flexible substrate, and a buffer layer 05, the semiconductor layer 01, the insulating layer 06 (for example, the ILD layer), the first metal layer 02, the insulating layer 06 (for example, the ILD layer), the second metal layer 03 (for example, the ILD layer), the insulating layer 06, the third metal layer 04, the insulating layer 06 (for example, the PLN layer), an anode 07 of the light-emitting element L1, and a pixel defining layer 08 that are disposed on the side of the base substrate 00 and laminated in sequence.

Referring to FIG. 13, at the first node N1 (i.e., the gate electrode of the drive transistor T7, the entire third metal layer 04 covers the semiconductor layer 01, the first metal layer 02, and the second metal layer 03. That is, an orthographic projection of the third metal layer 04 on the base substrate 00 is overlapped with orthographic projections of the semiconductor layer 01, the first metal layer 02, and the second metal layer 03 on the base substrate 00.

Referring to FIG. 14, in the channel region A1 of the first data write transistor T5, that is, at a double-gate electrode connecting position, the orthographic projection of the second metal layer 03 on the base substrate 00 is partially overlapped with the orthographic projection of the semiconductor layer 01 on the base substrate 00. In addition, in the channel region A1 of the first reset transistor T3, i.e., at the double-gate electrode connecting position, the orthographic projection of the second metal layer 03 on the base substrate 00 is partially overlapped with the orthographic projection of the semiconductor layer 01 on the base substrate 00.

Referring to FIG. 15, the anode of the light-emitting element L1 is in contact with the third metal layer 04 via the via hole penetrating the insulating layer 06. That is, the anode of the light-emitting element L1 is coupled to the third metal layer 04 by being connected to the third metal layer 04 in an overlapping manner.

In summary, the embodiments of the present disclosure provide a pixel circuit. The semiconductor layer in the pixel circuit can form the active layer of each of various transistors, the first metal layer in the pixel circuit can form the gate electrode of the transistor and the first capacitive electrode of the storage capacitor, and the second metal layer in the pixel circuit can form the second capacitive electrode of the storage capacitor. The second capacitive electrode is coupled to the drive power line. In addition, along a target direction, the second capacitive electrodes of each two adjacent pixel circuits are coupled to each other, thereby ensuring better working stability of each pixel circuit.

Figure 16:
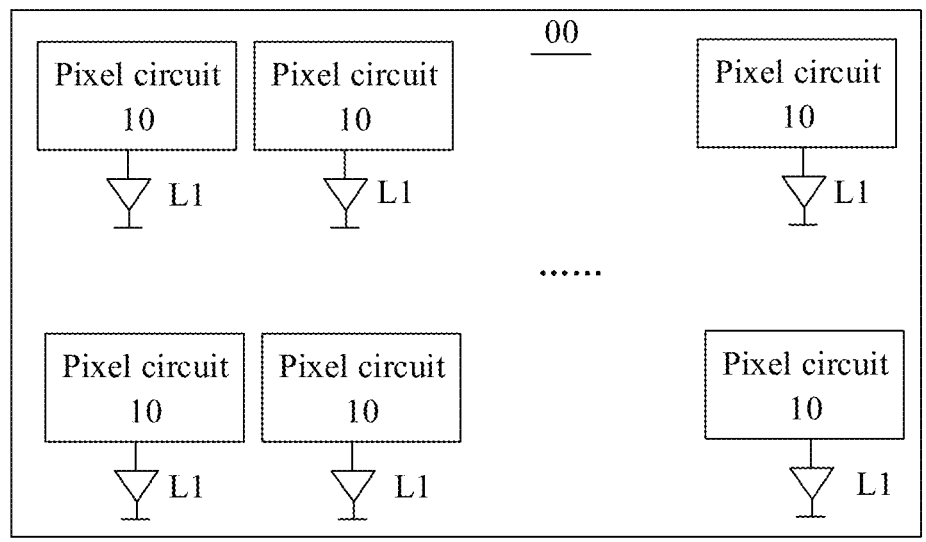
FIG. 16 is a schematic structural diagram of a display panel according to an embodiment of the present disclosure.

FIG. 16 is a schematic structural diagram of a display panel according to an embodiment of the present disclosure. As shown in FIG. 16, the display panel may include a base substrate 00, and a plurality of pixels on a side of the base substrate 00, and each pixel may include a plurality of sub-pixels. At least one sub-pixel may include a light-emitting element L1, and the pixel circuit 10 as shown in the above accompanying drawings.

The pixel circuit 10 may be connected to the light-emitting element L1 (for example, an anode of the light-emitting element L1). The pixel circuit 10 may be configured to drive the light-emitting element L1 to emit light.

Figure 17:
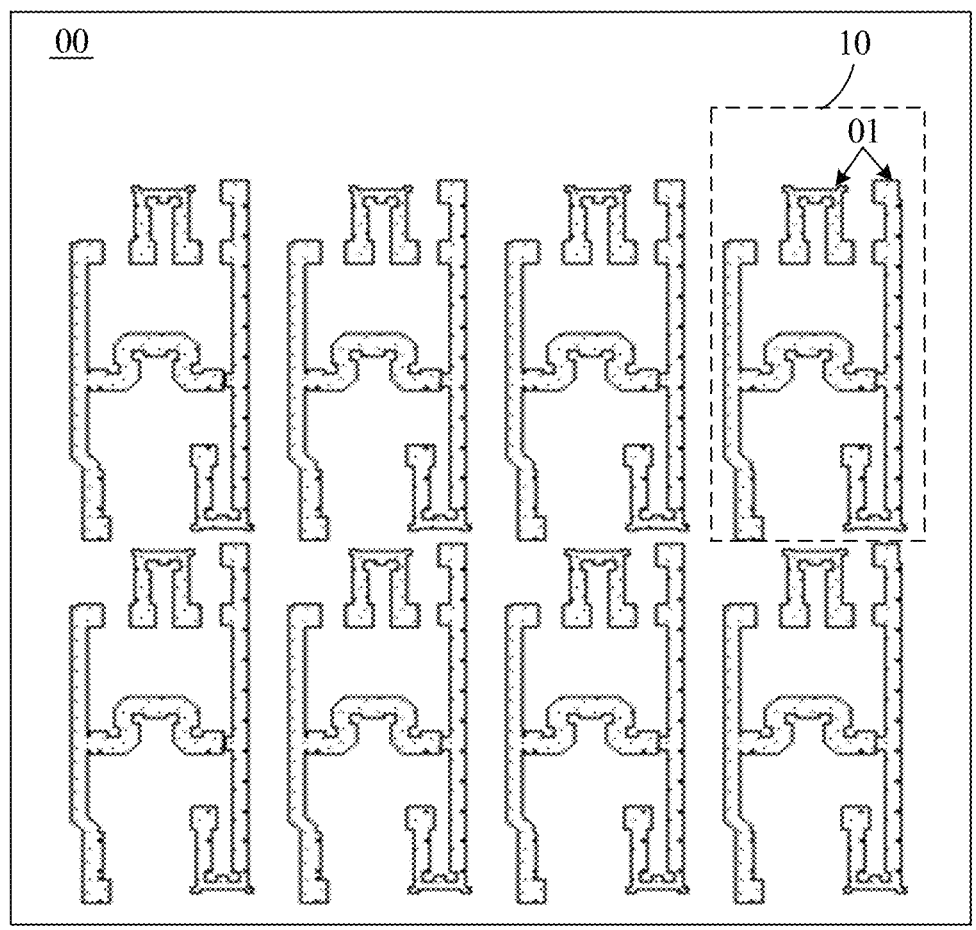
FIG. 17 is a partial structural layout of a plurality of pixel circuits according to an embodiment of the present disclosure.
Figure 18:
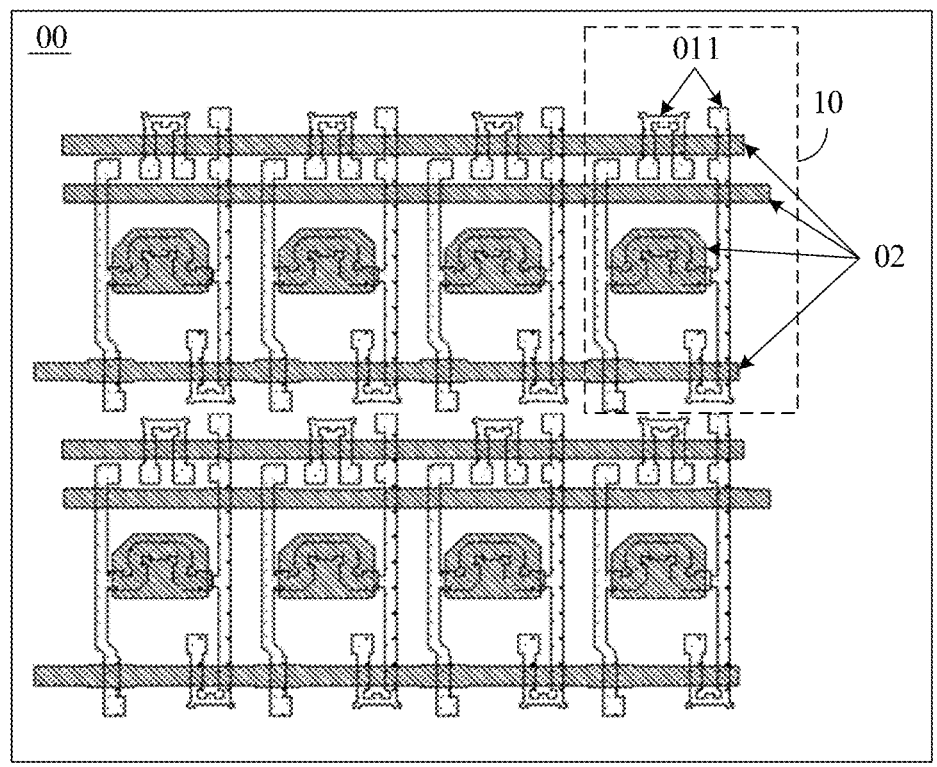
FIG. 18 is a partial structural layout of another plurality of pixel circuits according to an embodiment of the present disclosure.
Figure 19:
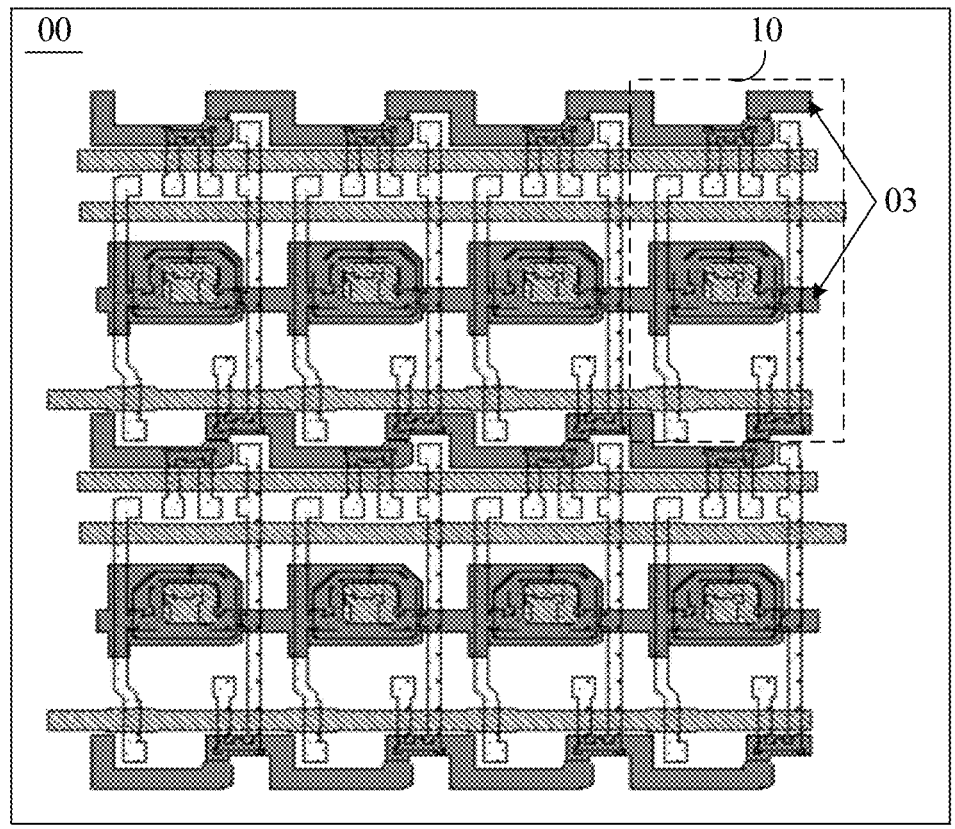
FIG. 19 is another partial structural layout including a plurality of pixel circuits according to an embodiment of the present disclosure.
Figure 20:
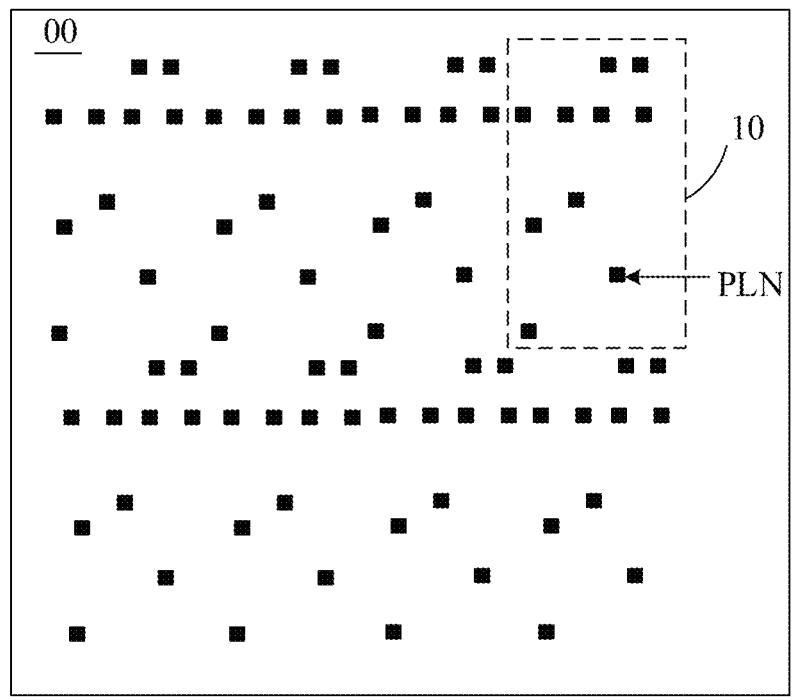
FIG. 20 is another partial structural layout including a plurality of pixel circuits according to an embodiment of the present disclosure.
Figure 21:
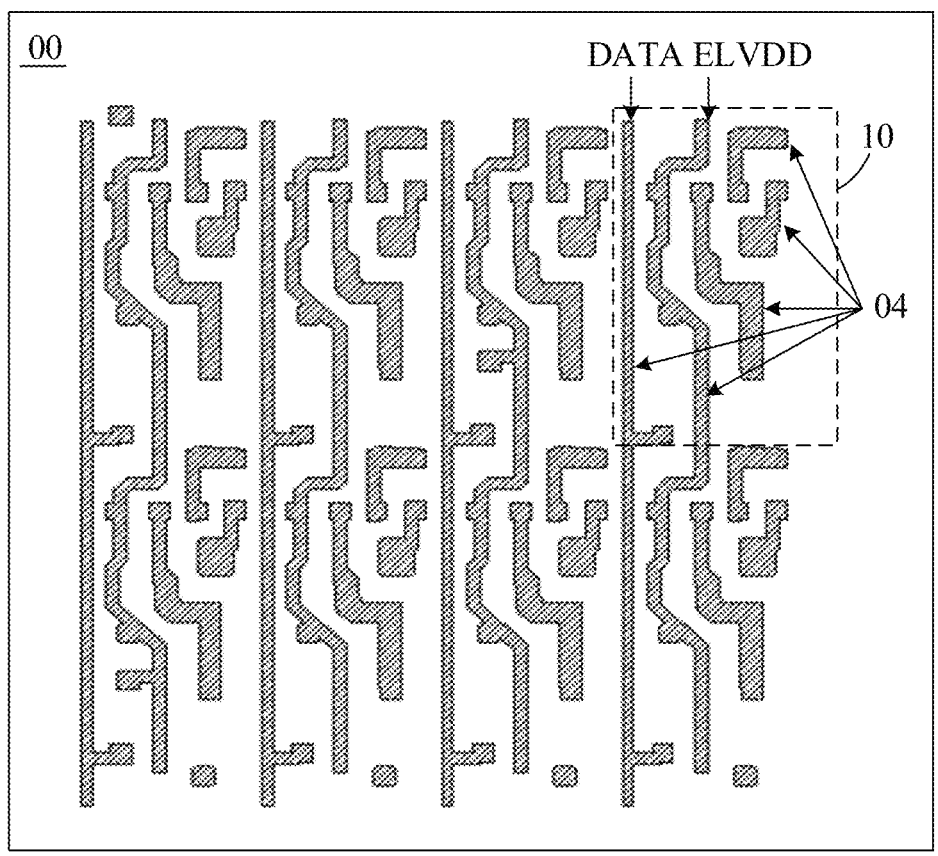
FIG. 21 is another partial structural layout including a plurality of pixel circuits according to an embodiment of the present disclosure.
Figure 22:
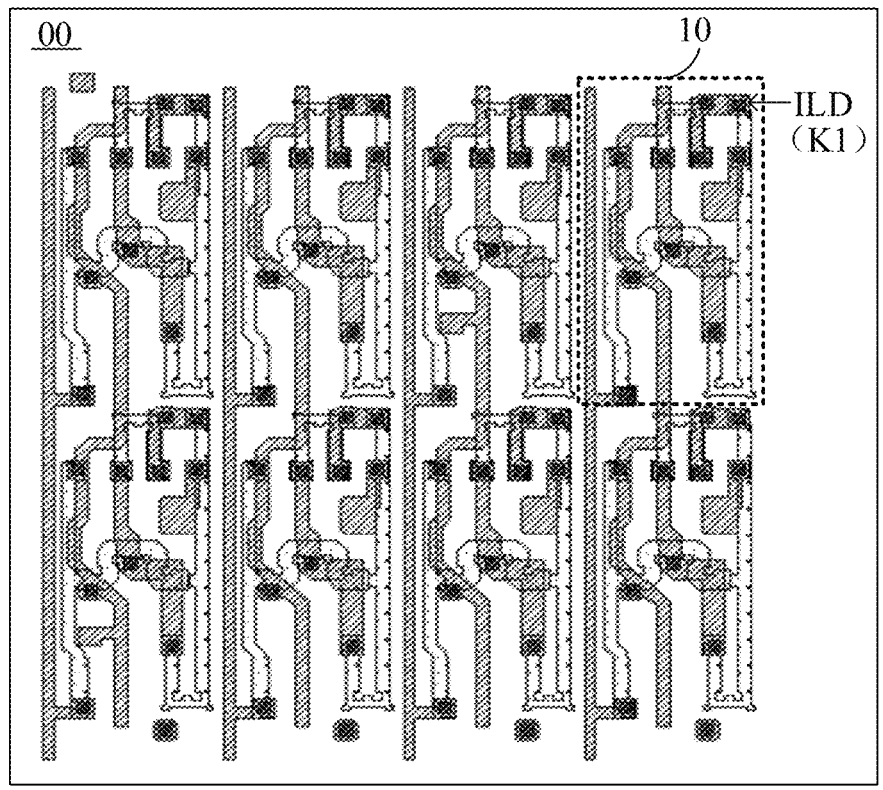
FIG. 22 is another partial structural layout including a plurality of pixel circuits according to an embodiment of the present disclosure.
Figure 23:
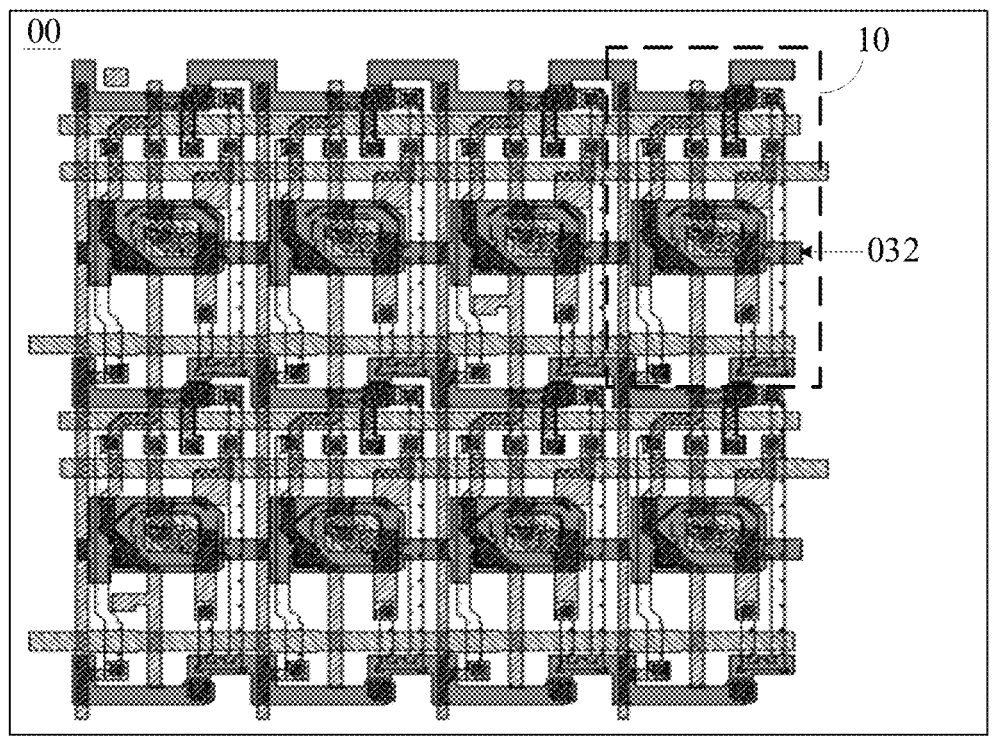
FIG. 23 is another partial structural layout including a plurality of pixel circuits according to an embodiment of the present disclosure.
Figure 24:
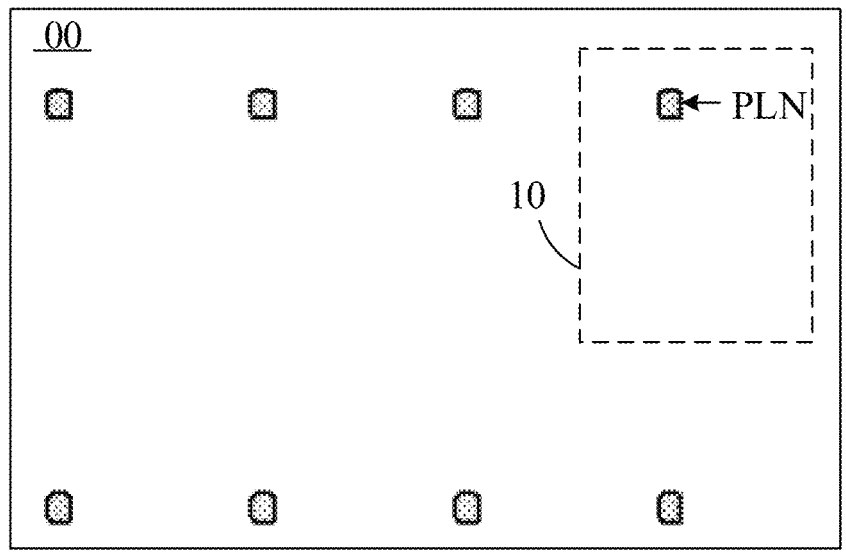
FIG. 24 is another partial structural layout including a plurality of pixel circuits according to an embodiment of the present disclosure.
Figure 25:
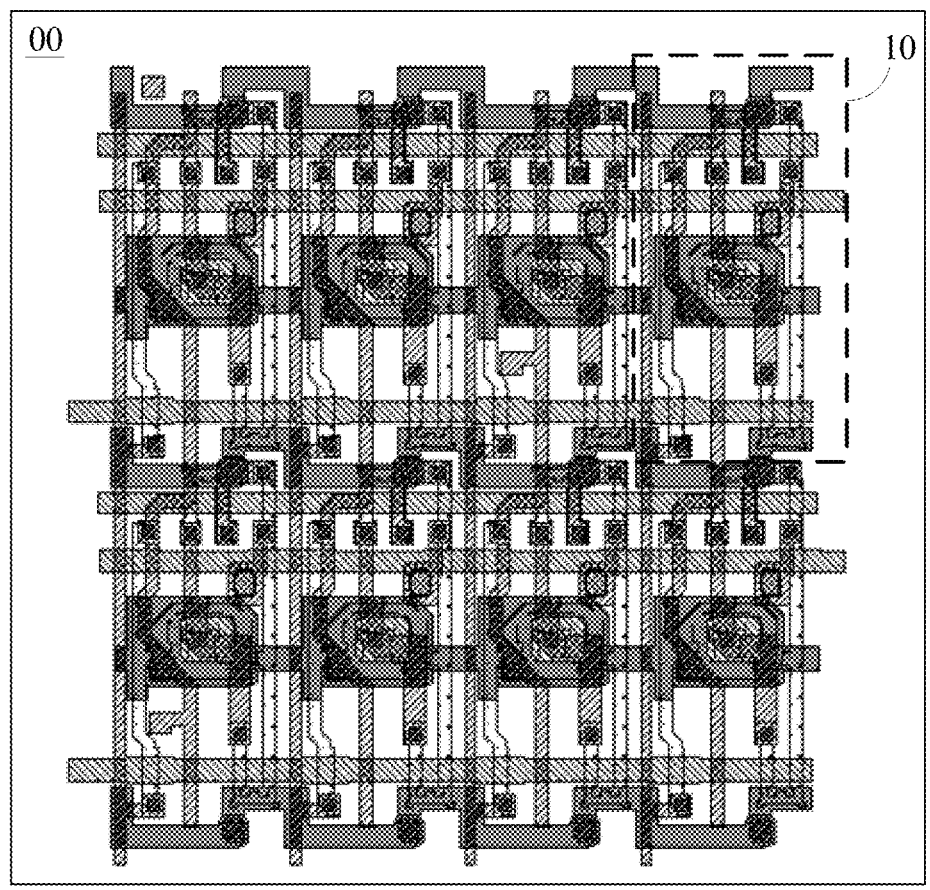
FIG. 25 is another partial structural layout including a plurality of pixel circuits according to an embodiment of the present disclosure.
Figure 26:
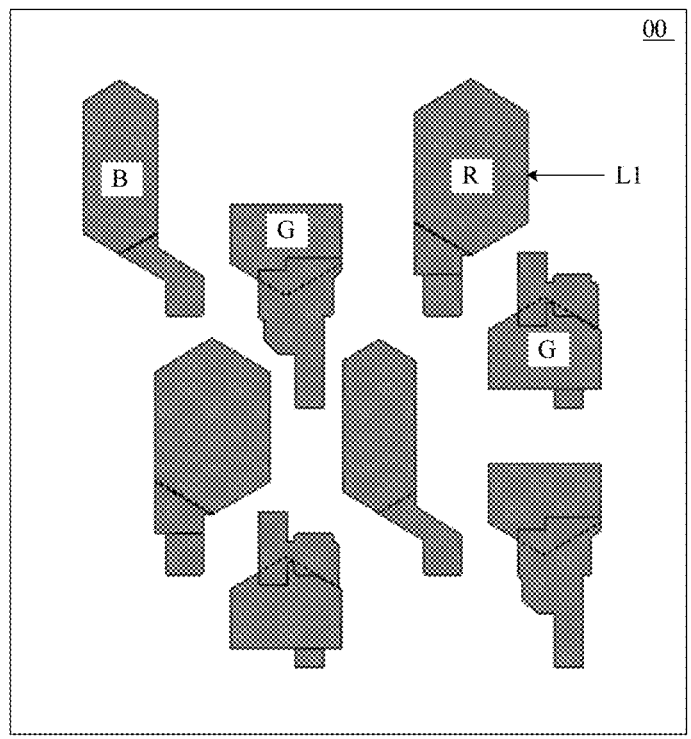
FIG. 26 is another partial structural layout including a plurality of pixel circuits according to an embodiment of the present disclosure.
Figure 27:
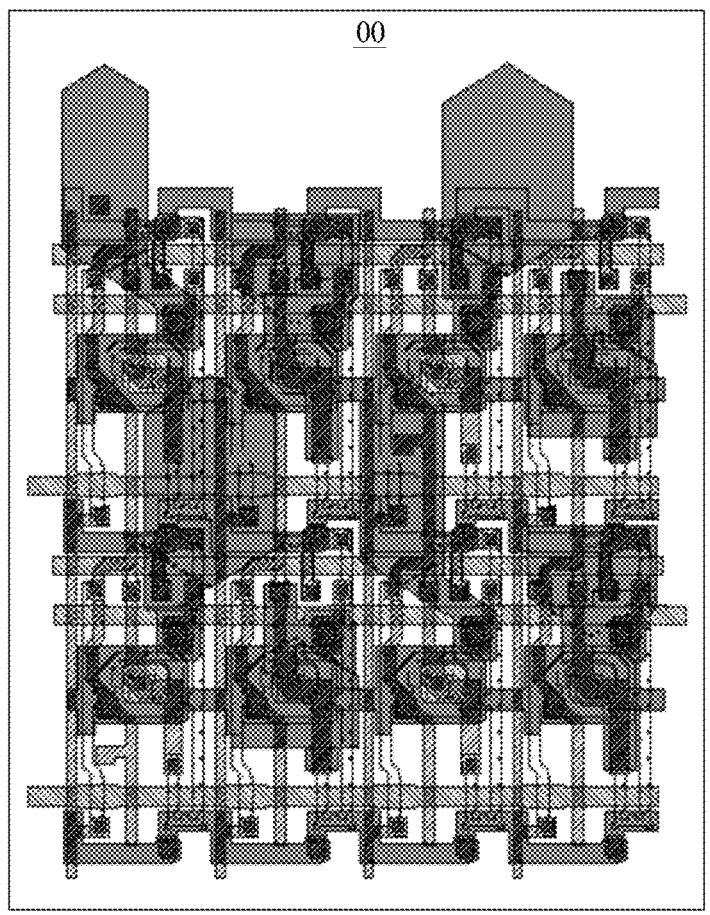
FIG. 27 is a complete hierarchical structure layout of a plurality of pixel circuits according to an embodiment of the present disclosure.

Optionally, the case that there are two rows, and each row includes 4 pixel circuits 10 (i.e., 8 pixel circuits in total) is taken as an example. FIG. 17 shows a structural layout of the display substrate including the semiconductor layer 01. FIG. 18 shows a structural layout of the display substrate including the semiconductor layer 01 and the first metal layer 02. FIG. 19 shows a structural layout of the display substrate including the semiconductor layer 01, the first metal layer 02, and the second metal layer 03. FIG. 20 shows a structural layout of the display substrate including the ILD layer. FIG. 21 shows a structural layout of the display substrate including the third metal layer 04. FIG. 22 shows a structural layout of the display substrate including the third metal layer 04 and the semiconductor layer 01. FIG. 23 shows a structural layout of the display substrate including the first metal layer 02, the second metal layer 03, the semiconductor layer 01, and the third metal layer 04. FIG. 24 shows a structural layout of the display substrate including the PLN layer. FIG. 25 shows a structural layout of the display substrate including the first metal layer 02, the second metal layer 03, the semiconductor layer 01, the third metal layer 04, and the PLN layer. FIG. 26 shows a structural layout of the display substrate including the light-emitting element L1. FIG. 27 shows a complete layout of the display substrate including all structures.

Optionally, referring to FIG. 11 and FIG. 27, the anode of the light-emitting element L1 may be overlapped with the light-emitting control line EM, and may be partially overlapped with the second capacitive electrode C02 in the pixel circuit.

Optionally, referring to FIG. 26 and FIG. 27, each pixel may include at least four sub-pixels. That is, each pixel may include at least four light-emitting elements L1.

In the at least four sub-pixels, the light-emitting elements L1 of at least two sub-pixels may be overlapped with the gate electrode drive line GATE coupled to the pixel circuit, and the light-emitting elements L1 of at least two sub-pixels may be distributed on both sides of the gate electrode drive line GATE.

For example, in the structure shown in FIG. 26 and FIG. 27, the light-emitting elements L1 of the four sub-pixels in each pixel may be a red light-emitting element L1, a blue light-emitting element L1, and two green light-emitting elements L1. The area of the green light-emitting element L1 is less than the area of the remaining color light-emitting elements L1. Moreover, the two green light-emitting elements L1 may be distributed on both sides of the gate electrode drive line GATE along the first direction X1. The red light-emitting element L1 and the blue light-emitting element L1 may be overlapped with the gate electrode drive line GATE coupled to the pixel circuit.

It should be noted that, in addition to the arrangement of the sub-pixels shown in FIG. 26 and FIG. 27, the sub-pixels may further be arranged along a radial direction, and the radial direction includes but is not limited to the radial direction along the first direction X1 and the radial direction along the second direction X2.

Referring to FIG. 23, two adjacent pixel circuits in the same column share one data signal line DATA and share one drive power line ELVDD. Two adjacent pixel circuits in the same row share one reset signal line Vinit.

Referring to FIG. 15, FIG. 23, and FIG. 27, the pixel circuit described in the embodiments of the present disclosure may further include the PLN layer on a side, distal from the base substrate 00, of the third metal layer 04. The anode of the light-emitting element L1 is disposed on a side, distal from the base substrate 00, of the PLN layer, and the anode of the light-emitting element L1 is coupled to the third metal layer 04 in the pixel circuit through a via hole penetrating the PLN layer.

Figure 28:
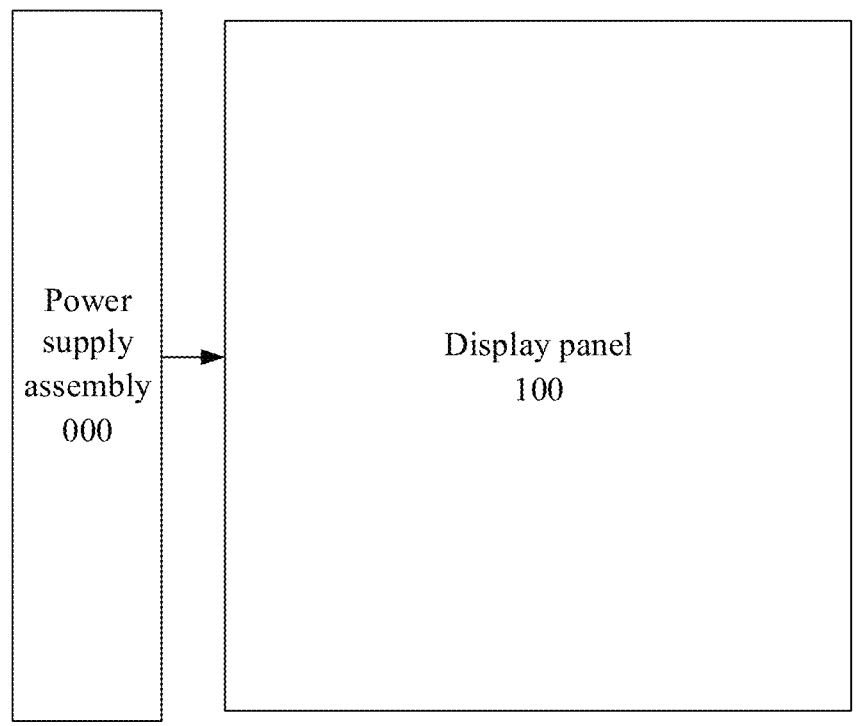
FIG. 28 is a schematic structural diagram of a display device according to an embodiment of the present disclosure.

FIG. 28 is a schematic structural diagram of a display device according to an embodiment of the present disclosure. As shown in FIG. 28, the display device may include a power supply assembly 000, and the display panel 100 as shown in the above accompanying drawings. The power supply assembly 000 may be coupled to the display panel 100 and may be configured to supply power to the display panel 100.

Optionally, the display device may be any product or component with a display function, such as a liquid crystal panel, an electronic paper, an organic light-emitting-diode (OLED) panel, a mobile phone, a tablet computer, a television, a monitor, a notebook computer, a digital photo frame, or a navigator.

It should be understood that the terms "first," "second," and the like in the description of the embodiments and claims of the present disclosure and the above accompanying drawings are configured to distinguish similar objects, and is not intended to describe a specific order or sequence. It should be understood that the data used in this way may be interchanged under appropriate circumstances, for example, may be implemented according to an order other than those presented in the illustrations or descriptions of the embodiments of the present disclosure.

It should be understood that the term "and/or" mentioned here indicates that there may be three relationships. For example, A and/or B may indicate that there are three cases where A exists separately, A and B exist simultaneously, and B exists separately. The symbol "/" herein generally indicates that an "or" relationship exists between contextual objects.

Described above are merely exemplary embodiments of the present disclosure, and are not intended to limit the present disclosure. Any modifications, equivalent substitutions, improvements, and the like within the spirit and principles of the disclosure fall within the protection scope of the present disclosure.

What is claimed is:

1. A pixel circuit, comprising:
  a semiconductor layer on a side of a base substrate, wherein the semiconductor layer is configured to form an active layer of each of various transistors in the pixel circuit, the active layer comprising a channel region, and a source electrode region and a drain electrode region that are disposed on both sides of the channel region;
  a first metal layer on the side of the base substrate, wherein the first metal layer is configured to form a gate electrode of the transistor and a first capacitive electrode of a storage capacitor in the pixel circuit, an overlap region being present between the gate electrode of the transistor and the channel region; and
  a second metal layer on the side of the base substrate, wherein the second metal layer is configured to form a second capacitive electrode of the storage capacitor, the second capacitive electrode being at least partially overlapped with the first capacitive electrode, and the second capacitive electrode being coupled to a drive power line extending along a first direction;
  wherein the gate electrodes of the transistors and the storage capacitor are arranged in sequence along the first direction; the second capacitive electrodes of each two adjacent pixel circuits are coupled via a connection portion along a second direction, wherein the connection portion is disposed on the same layer as the second metal layer, the connection portion is parallel to the channel region of at least one of the various transistors, and the connection portion is overlapped with a data signal line extending along the first direction, the first direction being perpendicular to the second direction; in the various transistors, a gate electrode of a light-emitting control transistor is disposed between a gate electrode of a reset transistor and a gate electrode of a data write transistor;
  wherein the data write transistor comprises a first data write transistor and a second data write transistor; the reset transistor comprises a first reset transistor and a second reset transistor; and the light-emitting control transistor comprises a first light-emitting control transistor and a second light-emitting control transistor; wherein
    a drain electrode region of the first data write transistor is coupled to a drain electrode region of a drive transistor in each of the transistors, and a source electrode region of the first data write transistor is coupled to a gate electrode of the drive transistor; a drain electrode region of the second data write transistor is coupled to a source electrode region of the drive transistor, and a source electrode region of the second data write transistor is coupled to the data signal line; and both a gate electrode of the first data write transistor and a gate electrode of the second data write transistor are coupled to a gate electrode drive line;
    both a source electrode region of the first reset transistor and a source electrode region of the second reset transistor are coupled to a reset signal line; both a gate electrode of the first reset transistor and a gate electrode of the second reset transistor are coupled to a reset control line; a drain electrode region of the first reset transistor is coupled to the gate electrode of the drive transistor in each of the transistors, and a drain electrode region of the second reset transistor is coupled to an anode of a light-emitting element; and
    a drain electrode region of the first light-emitting control transistor is coupled to the source electrode region of the drive transistor, and a source electrode region of the first light-emitting control transistor is coupled to the drive power line; a drain electrode region of the second light-emitting control transistor is coupled to the anode of the light-emitting element, a source electrode region of the second light-emitting control transistor is coupled to the drain electrode region of the drive transistor, and both a gate electrode of the first light-emitting control transistor and a gate electrode of the second light-emitting control transistor are coupled to a light-emitting control line;
  and the second metal layer comprises a first metal pattern and a second metal pattern; wherein the first metal pattern is configured to form the second capacitive electrode, and the second metal pattern is partially overlapped with an active layer of the first data write transistor.

2. The pixel circuit according to claim 1, wherein along the first direction, the gate electrode of the reset transistor and the gate electrode of the data write transistor are disposed on both sides of the storage capacitor.

3. The pixel circuit according to claim 2, wherein along the first direction, the gate electrode of the reset transistor and the gate electrode of the light-emitting control transistor are disposed on the same side of the storage capacitor.

4. The pixel circuit according to claim 1, wherein the semiconductor layer comprises a first semiconductor pattern and a second semiconductor patterns that are spaced apart; wherein
both the first semiconductor pattern and the second semiconductor pattern are coupled to the reset signal line; and
the first semiconductor pattern is configured to form an active layer of the first reset transistor, and the second semiconductor pattern is configured to form active layers of the transistors other than the first reset transistor.

5. The pixel circuit according to claim 1, wherein each of an active layer of the first data write transistor and an active layer of the first reset transistor comprises at least two bent portions.

6. The pixel circuit according to claim 5, wherein the pixel circuit meets at least one of the following requirements:
an orthographic projection of the active layer of the first data write transistor on the base substrate is U-shaped; or
an orthographic projection of the active layer of the first reset transistor on the base substrate is U-shaped.

7. The pixel circuit according to claim 1, wherein the pixel circuit meets at least one of the following requirements:
the second metal pattern is further partially overlapped with an active layer of the first reset transistor; or
the second metal pattern is configured to receive a reset signal.

8. The pixel circuit according to claim 7, wherein the second metal pattern is further partially overlapped with the active layer of the first reset transistor; and
the second metal pattern comprises a first extending region and a second extending region; wherein
the first extending region is overlapped with the active layer of the first data write transistor, and an extending line of the first extending region is overlapped with a coupled part of the second data write transistor and the data signal line; and
the second extending region is overlapped with the active layer of the first reset transistor;
wherein an extending direction of the first extending region is parallel to an extending direction of the second extending region.

9. The pixel circuit according to claim 1, wherein the pixel circuit further comprises a third metal layer on the side of the base substrate, the third metal layer comprising a first metal block, a second metal block, a third metal block, a fourth metal block, and a fifth metal block that are spaced apart;
wherein the first metal block is configured to receive a data signal; the second metal block is configured to receive a drive power signal; both the drain electrode region of the first reset transistor and the drain electrode region of the first data write transistor are coupled to the gate electrode of the drive transistor through the third metal block; both the source electrode region of the first reset transistor and the source electrode region of the second reset transistor are coupled to the reset signal line through the fourth metal block; and both the drain electrode region of the second reset transistor and the source electrode region of the second light-emitting control transistor are coupled to the anode of the light emitting element through the fifth metal block.

10. The pixel circuit according to claim 9, wherein the second metal block comprises a first extending portion and a second extending portion that extend along the first direction and are coupled to each other;
wherein an included angle between the first extending portion and the second extending portion is less than or equal to 90 degrees, and the included angle faces towards the storage capacitor; an extending line of the first extending portion is overlapped with a hollowed region of the second capacitive electrode, and along the second direction, the second extending portion and the first metal block are disposed on the same side of the hollowed region.

11. The pixel circuit according to claim 10, wherein the second metal block further comprises a third extending portion extending along the first direction, the third extending portion being coupled to the second extending portion;
wherein an included angle between the third extending portion and the second extending portion is less than 90 degrees, the included angle faces towards the storage capacitor, and an extending line of the third extending portion is overlapped with the hollowed region of the second capacitive electrode.

12. The pixel circuit according to claim 9, wherein the pixel circuit meets at least one of the following requirements:
along the first direction, the third metal block is across the light-emitting control line; or
the fourth metal block comprises a first conductive segment and a second conductive segment; wherein
the first conductive segment and the second conductive segment are coupled to the source electrode region of the first reset transistor and the source electrode region of the second reset transistor in the same pixel circuit; and
the first conductive segment extends along the first direction, the second conductive segment extends along the second direction, and the first conductive segment is across the reset signal line; or
the fifth metal block comprises a main body segment and an extending segment; wherein along the first direction, the fifth metal block is across the light-emitting control line, and the extending segment in the fifth metal block is overlapped with the light-emitting control line.

13. The pixel circuit according to claim 12, wherein along the first direction, the third metal block is across the light-emitting control line; and
along the first direction, the third metal block is across the storage capacitor.

14. A display panel, comprising a base substrate, and a plurality of pixels on a side of the base substrate, wherein each of the plurality of pixels comprises a plurality of sub-pixels, at least one of the plurality of sub-pixels comprising a light-emitting element, and the pixel circuit as defined in claim 1;
wherein the pixel circuit is connected to the light-emitting element, and the pixel circuit is configured to drive the light-emitting element to emit light.

15. The display panel according to claim 14, wherein the display panel meets at least one of the following requirements:
the anode of the light-emitting element is overlapped with the light-emitting control line coupled to the pixel circuit, and is partially overlapped with the second capacitive electrode in the pixel circuit;

or each of the plurality of pixels comprises at least four sub-pixels; wherein in the at least four sub-pixels, light-emitting elements of at least two sub-pixels are overlapped with the gate electrode drive line coupled to the pixel circuit, and the light-emitting elements of at least two sub-pixels are distributed on both sides of the gate electrode drive line.

16. The display panel according to claim 14, wherein the display panel meets at least one of the following requirements:

two adjacent pixel circuits in the same column share one data signal line and share one drive power line; and two adjacent pixel circuits in the same row share one reset signal line;

or the pixel circuit further comprises a planarization layer on a side, distal from the base substrate, of a third metal layer, wherein the anode of the light-emitting element is disposed on a side, distal from the base substrate, of the planarization layer, and the anode of the light-emitting element is coupled to the third metal layer through a via hole penetrating the planarization layer.

17. A display device, comprising a power supply assembly, and the display panel according to claim 14;

wherein the power supply assembly is coupled to the display panel and is configured to supply power to the display panel.

\* \* \* \* \*